United States Patent
Kroushl et al.

(10) Patent No.: US 10,211,606 B2
(45) Date of Patent: Feb. 19, 2019

(54) MOTOR CONTROL CENTER UNITS WITH MULTI-PURPOSE SHUTTER CAMS AND RELATED UNITS

(71) Applicant: Eaton Intelligent Power Limited, Dublin (IE)

(72) Inventors: Daniel Boyd Kroushl, Clayton, NC (US); Alfred Gregory Beard, Raleigh, NC (US); Edgar Yee, Chapel Hill, NC (US)

(73) Assignee: Eaton Intelligent Power Limited, Dublin (IE)

( * ) Notice: Subject to any disclaimer, the term of this patent is extended or adjusted under 35 U.S.C. 154(b) by 0 days.

(21) Appl. No.: 15/786,248

(22) Filed: Oct. 17, 2017

(65) Prior Publication Data

US 2018/0152007 A1 May 31, 2018

Related U.S. Application Data

(60) Provisional application No. 62/427,461, filed on Nov. 29, 2016.

(51) Int. Cl.
| | |
|---|---|
| *H02B 11/133* | (2006.01) |
| *H02B 11/24* | (2006.01) |
| *H01H 9/22* | (2006.01) |
| *H01H 71/56* | (2006.01) |
| *H02B 1/36* | (2006.01) |

(Continued)

(52) U.S. Cl.
CPC ................. *H02B 1/36* (2013.01); *H01H 9/22* (2013.01); *H01H 71/56* (2013.01); *H02B 1/306* (2013.01); *H02B 1/38* (2013.01); *H02B 11/24* (2013.01); *H05K 5/0017* (2013.01); *H05K 5/0021* (2013.01); *H05K 5/023* (2013.01); *H05K 5/0217* (2013.01); *H05K 5/0221* (2013.01); *H02B 11/133* (2013.01)

(58) Field of Classification Search
CPC . H01H 9/22; H01H 71/56; H02B 1/36; H02B 11/133; H02B 11/24
See application file for complete search history.

(56) References Cited

U.S. PATENT DOCUMENTS

| | | |
|---|---|---|
| 1,838,898 A | 12/1931 | Aldeen |
| 2,042,886 A | 6/1936 | Ferguson |

(Continued)

FOREIGN PATENT DOCUMENTS

| | | |
|---|---|---|
| FR | 2747877 | 10/1997 |
| FR | 2814321 | 3/2002 |

(Continued)

OTHER PUBLICATIONS

Arc-flash—the threat that is real, Freedom Arc Resistant Motor Control Center, product brochure, EATON, Mar. 2014, 2 pages.

(Continued)

*Primary Examiner* — Robert J Hoffberg
(74) *Attorney, Agent, or Firm* — Myers Bigel, P.A.

(57) ABSTRACT

Motor control centers have units or buckets with multi-purpose shutter cams that slide shutters right and left to controllably block access to a portal of an isolation lead screw that can extend and retract power connectors and that provides one or more safety interlock engagement features that prevent certain actions depending on the operating state of the buckets.

22 Claims, 22 Drawing Sheets

(51) Int. Cl.
*H02B 1/30* (2006.01)
*H02B 1/38* (2006.01)
*H05K 5/00* (2006.01)
*H05K 5/02* (2006.01)

(56) References Cited

U.S. PATENT DOCUMENTS

| | | | |
|---|---|---|---|
| 2,809,085 | A | 10/1957 | Fall |
| 2,914,707 | A | 11/1959 | Timmerman |
| 2,921,998 | A | 1/1960 | Pokorny et al. |
| 3,203,575 | A | 8/1965 | Anderson et al. |
| 3,479,104 | A | 11/1969 | Kobryner |
| 4,024,441 | A | 5/1977 | Coyle et al. |
| 4,086,452 | A | 4/1978 | Collins |
| 4,090,230 | A | 5/1978 | Fuller et al. |
| 4,206,944 | A | 6/1980 | Kumagai et al. |
| 4,371,223 | A | 2/1983 | Grunert et al. |
| 4,486,815 | A | 12/1984 | Takahashi |
| 4,503,408 | A | 3/1985 | Mrenna et al. |
| 4,612,424 | A * | 9/1986 | Clark .................. H01H 9/22 200/330 |
| 4,754,367 | A | 6/1988 | Bohnen |
| 4,806,710 | A * | 2/1989 | Kalvaitis ............. H01H 9/22 200/50.12 |
| 4,835,350 | A * | 5/1989 | Ozu ..................... H01H 9/22 200/50.12 |
| 4,926,286 | A | 5/1990 | Maki et al. |
| 5,343,355 | A | 8/1994 | Ishikawa |
| 5,609,244 | A * | 3/1997 | Reiter .................. H01H 9/22 200/43.11 |
| 5,625,531 | A | 4/1997 | Padilla et al. |
| 5,910,760 | A | 6/1999 | Malingowski et al. |
| 6,031,192 | A | 2/2000 | Liebetruth |
| 6,194,983 | B1 | 2/2001 | Bogdon et al. |
| 6,711,001 | B2 | 3/2004 | Hernandez et al. |
| 6,943,999 | B2 * | 9/2005 | Gray .................. H02B 11/133 361/1 |
| 7,186,933 | B2 | 3/2007 | Turner |
| 7,420,133 | B2 | 9/2008 | Farrow et al. |
| 7,684,199 | B2 | 3/2010 | Yee et al. |
| 7,688,572 | B2 | 3/2010 | Yee et al. |
| 7,800,888 | B2 | 9/2010 | Morris et al. |
| 7,965,493 | B2 | 6/2011 | Leeman et al. |
| 7,987,555 | B2 | 8/2011 | Chen et al. |
| 8,108,971 | B2 | 2/2012 | Florek |
| 8,199,022 | B2 | 6/2012 | Morris et al. |
| 8,243,422 | B2 | 8/2012 | Leeman et al. |
| 8,248,761 | B2 | 8/2012 | Leeman et al. |
| 8,305,736 | B2 | 11/2012 | Yee et al. |
| 8,511,510 | B2 | 8/2013 | Pratte et al. |
| 8,537,518 | B2 | 9/2013 | Morris et al. |
| 8,590,106 | B2 | 11/2013 | Lu |
| 8,817,454 | B2 | 8/2014 | Morris et al. |
| 8,934,218 | B2 | 1/2015 | Morris |
| 9,153,947 | B2 | 10/2015 | Fleitmann et al. |
| 9,451,718 | B2 | 9/2016 | Oneufer et al. |
| 9,531,169 | B2 | 12/2016 | Oneufer et al. |
| 9,843,174 | B2 * | 12/2017 | Cieply ................ H02B 11/133 |
| 10,020,642 | B2 * | 7/2018 | Oneufer ................ H02B 1/46 |
| 2008/0022673 | A1 | 1/2008 | Morris et al. |
| 2008/0023211 | A1 | 1/2008 | Yee et al. |
| 2008/0258667 | A1 | 10/2008 | Morris et al. |
| 2009/0086414 | A1 | 4/2009 | Yee et al. |
| 2013/0077210 | A1 | 3/2013 | Morris |
| 2013/0088812 | A1 | 4/2013 | Yee et al. |
| 2014/0362498 | A1 | 12/2014 | Morris et al. |
| 2015/0103472 | A1 | 4/2015 | Oneufer et al. |
| 2015/0221458 | A1 | 8/2015 | Oneufer et al. |
| 2015/0380910 | A1 | 12/2015 | Oneufer et al. |
| 2015/0382492 | A1 | 12/2015 | Oneufer et al. |
| 2017/0063056 | A1 | 3/2017 | Oneufer et al. |

FOREIGN PATENT DOCUMENTS

| | | |
|---|---|---|
| JP | S 59-9459 U | 1/1984 |
| JP | 2011-234542 A | 11/2011 |
| WO | WO 2015/047236 A1 | 4/2015 |

OTHER PUBLICATIONS

Drawings/Views of internal components of an MCC (FLASHGARD) unit sold by Eaton, Inc. at least as early as 2012 (6 pages).

International Search Report and the Written Opinion of the International Searching Authority corresponding to International Patent Application No. PCT/IB2015/054355 (17 pages) (dated Oct. 26, 2015).

International Search Report and the Written Opinion of the International Searching Authority corresponding to International Patent Application No. PCT/IB2015/054356 (11 pages) (dated Aug. 19, 2015).

Invitation to Pay Additional Fees for related PCT Application No. PCT/IB2015/054356, dated Aug. 19, 2015, 6 pages.

International Search Report and the Written Opinion of the International Searching Authority corresponding to related International Patent Application No. PCT/US2017/057802 (15 pages) (dated Jan. 19, 2018).

"Centerline® 2100 SecureConnect™: Help Reduce Exposure to Electrical Shock and Hazards" *Product Information Sheet, Allen-Bradley* www.rockwellautomation.com (4 pages).

"Evolution E9000* MCC with AFM Arc Flash Mitigation Units for Low-Voltage Motor Control" *Fact Sheet, GE Industrial Solutions* (2 pages) (2014).

* cited by examiner

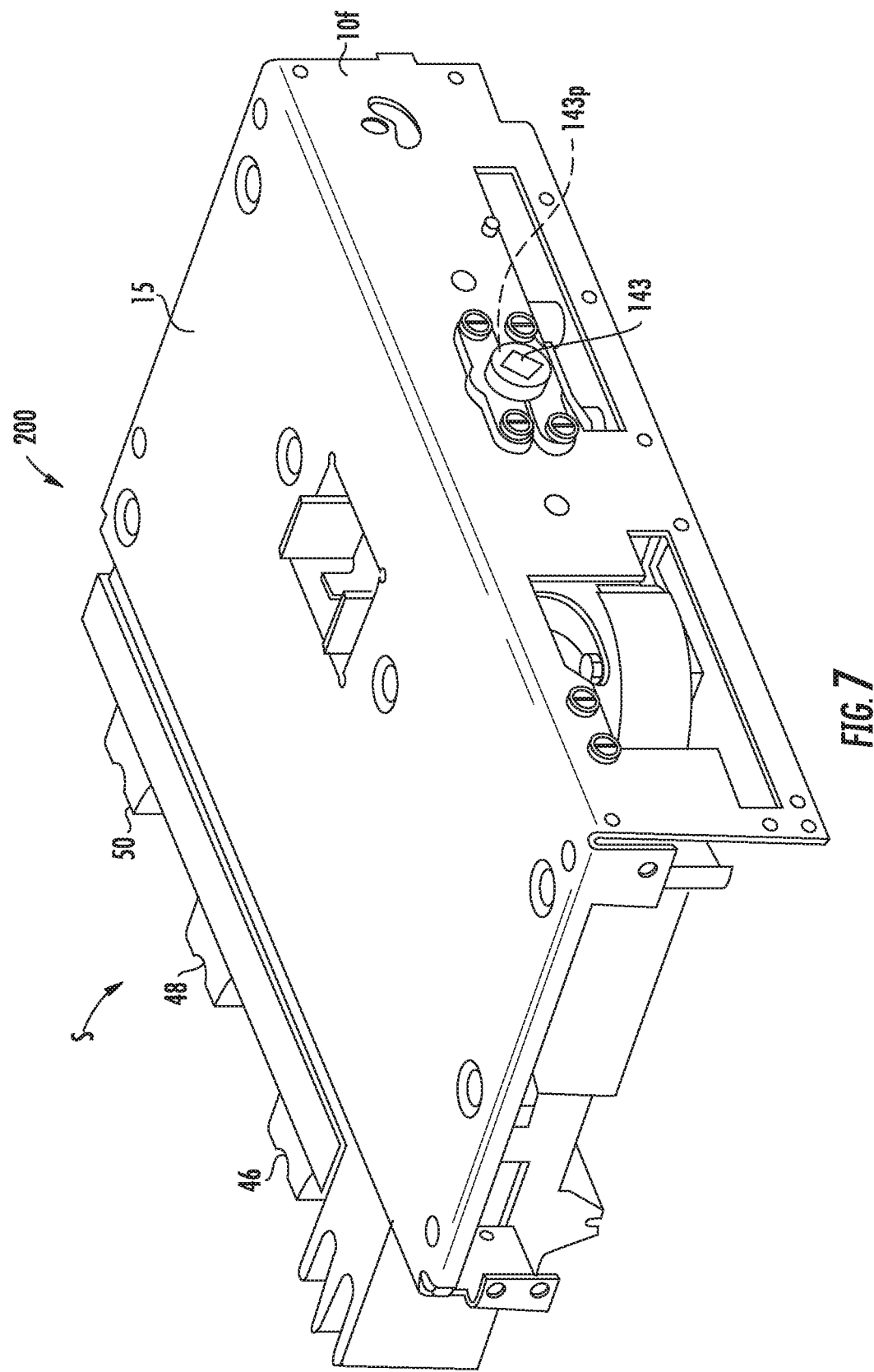

MOTOR CONTROL CENTER UNITS WITH MULTI-PURPOSE SHUTTER CAMS AND RELATED UNITS

RELATED APPLICATIONS

This application claims the benefit of and priority to U.S. Provisional Application Ser. No. 62/427,461, filed Nov. 29, 2016, the contents of which are hereby incorporated by reference as if recited in full herein.

FIELD OF THE INVENTION

The present invention relates to motor control systems and more particularly to motor control center units.

BACKGROUND OF THE INVENTION

As is known to those of skill in the art, Motor Control Centers (MCC) can include cabinets or enclosures that hold multiple, typically modular, bucket assemblies of various sizes. See, e.g., U.S. Pat. No. 4,024,441, the contents of which are hereby incorporated by reference as if recited in full herein. Eaton Corporation has introduced a MCC product line with compact bucket assemblies that conveniently plug into a slot or space in an MCC cabinet. The product is sold under the product name, Freedom 2100 MCC. See also, U.S. Patent Application Publication Serial Number US2013/0077210, the contents of which are hereby incorporated by reference as if recited in full herein.

Motor control centers are used, for example, in some commercial and industrial applications to distribute electrical power to a variety of loads (e.g., without limitation, relatively high power electrical motors, pumps, and other loads).

The bucket assemblies (also known as "buckets" or "units") can include one or more handles that are disposed on the front door. The handle can be a rotary handle configured to convert the rotary motion of the rotary handle to the linear or translational motion of a circuit breaker linear action lever. See, e.g., US. Pat. Nos. 6,194,983 and 7,186,933, the contents of which are incorporated by reference as if recited in full herein. The handle is typically mounted parallel with the plane of the faceplate of the molded case circuit breaker, but spaced outwardly from it by the depth of the handle mechanism. Usually, a series of linkages are utilized to interconnect the rotary motion of the rotary handle to the linear motion of the circuit breaker handle or lever.

FIG. 1, for example, shows a portion of a prior art motor control center 100. The motor control center 100 includes a multi-compartment enclosure 12 for receiving a plurality of motor control units 10. Typically, each bucket 10 is a removable, pull-out unit that has a respective door 22 (which may be under a front panel) and each unit can be held inside a cabinet frame 100f or housing enclosure. The door 22 is typically coupled to the housing 12 by hinges 28 (shown in phantom line drawing in FIG. 1) to permit access to motor control components of the bucket 10 while it is installed in the enclosure 12. For example and without limitation, the door 22 permits access to a circuit breaker assembly 30, a stab indicator 32, a shutter indicator 34, and a line contact actuator 36. When the bucket 10 is fully installed and electrically connected, a user-operator may operate a disconnect handle 20h. In a de-energized state of the motor control center 100, the user-operator may operate an isolation feature by moving an external slide 140 and inserting crank 42 through an access portal or hole 43 in the door 22 to access the line contact actuator 36 to move a number of line contacts (see, for example, stab contacts 46,48,50 of the prior art bucket 10 of FIG. 2) to an isolated position out of (see FIG. 2) electrical contact with power lines or buses 52 (partially shown in phantom line drawing in FIG. 2) of the motor control center 100. Motor control centers and units therefore (also sometimes called "subunits") are described in greater detail, for example, in commonly assigned U.S. Patent Application Publications 2009/0086414, 2008/0258667, 2008/0023211 and 2008/0022673, which are hereby incorporated herein by reference Despite the above, there remains a need for alternate bucket configurations.

SUMMARY OF EMBODIMENTS OF THE INVENTION

Embodiments of the invention provide units with a sliding shutter to prevent access to a portal for an isolation feature which allows a user-operator to retract stabs in the units.

Embodiments of the invention are directed to a bucket that includes: a bucket housing with laterally spaced apart sidewalls and at least one front panel; an operator handle residing in front of the front panel and having an inwardly extending drive shaft; a shutter cam attached to the drive shaft. The shutter cam includes a first cam segment with a curvilinear outer perimeter and a second cam segment with a curvilinear outer perimeter. The bucket also includes at least one shutter in communication with the shutter cam, the at least one shutter comprising a primary body with a shutter portal. The at least one shutter also including first and second laterally spaced apart outwardly projecting members that reside at a level below the shutter portal. The first cam segment of the shutter cam engages the first member to laterally slide the shutter in a first direction to a position that misaligns the shutter portal with a socket of a lead screw in the bucket when the operator handle is in a first position. The first cam segment of the shutter cam engages the second member to laterally slide the shutter in a second direction opposite the first direction to a position that aligns the shutter portal with the socket of the leadscrew when the operator handle is in a second position. The second cam segment provides at least one interlock engagement feature for releasably engaging at least one of a cabinet lock pin, a manual key lock and a door latch that prevents the operator handle from rotating.

The second cam segment can reside behind the first cam segment, in a longitudinal direction associated with a front to back direction of the bucket housing.

The at least one shutter can have a lateral extension with a downwardly extending planar vertically oriented segment residing above the drive shaft and positioned longitudinally between the first and second cam segments of the shutter cam, the downwardly extending planar vertically oriented segment can include the first and second laterally spaced apart outwardly projecting members.

The first and second cam segments can be joined at a neck portion that has a channel that receives the drive shaft. The first cam segment can have a curvilinear outer perimeter portion facing an adjacent longitudinally and laterally spaced apart curvilinear perimeter portion of the second cam segment.

The shutter cam can be a three dimensional single monolithic member.

The shutter cam can further include a first forwardly projecting segment attached to the first cam segment and a second forwardly projecting segment attached to the second cam segment.

The first cam segment can have a distance that is less than a maximal radius of the second cam segment, the radius measured from a centerline of the drive shaft.

The second cam segment can have a portion of the outer perimeter that is adjacent a portion of the outer perimeter of the first cam segment with a curvilinear gap space between the adjacent portions.

The shutter cam can also include at least one of: (i) a first forwardly projecting segment attached to the first cam segment and a second forwardly projecting segment attached to the second cam segment; (ii) at least one lug access aperture to thereby allow access to a phase A, B or C lug screw in an OFF position associated with non-conduction; or (iii) a planar rear surface with the second cam segment having an outer perimeter wall that is orthogonal to the planar rear surface and projects rearward a distance from the planar rear surface of the second cam segment.

Optionally the second cam segment can have a portion of the outer perimeter that faces a curvilinear gap space that has a circumferential angular extent, measured from a center of the shaft, that is between 90-270 degrees.

The bucket can include a laterally extending cabinet lock pin residing behind the shutter cam in the bucket housing. The laterally extending cabinet lock pin can be attached to an actuator rod that slidably moves the cabinet lock pin between engaged and disengaged positions. The actuator rod can extend forward toward the operator handle a length sufficient to engage a first portion of the second cam segment of the shutter cam as the at least one interlock feature of the second cam segment and block the operator handle from rotating to an ON position as the first position when the cabinet lock is in the engaged position.

A different second portion of the outer perimeter of the second cam segment of the shutter cam can reside adjacent the actuator rod when the actuator rod is in the engaged position as a second of the at least one interlock feature and can block movement of the actuator rod when the operator handle is in the ON position as the first position to thereby prevent the cabinet lock pin from being moved to the disengaged position.

The outer perimeter of the second cam segment can have a straight portion adjacent a curvilinear outer portion. The actuator rod can extend over the straight portion as the first portion to engage the second cam segment of the shutter cam and block the handle from rotating to the ON position when the cabinet lock is in the engaged position.

The second cam segment of the shutter cam can have a lower interior recessed space as the door interlock feature as the at least one interlock feature and that releasably engages a spring-loaded arm to thereby block the shutter cam from rotating from OFF to ON when a door of the bucket is open.

The bucket can also include a door latch that is attached to the shutter cam and controllably engages a cabinet door to prevent a cabinet door from opening if the operator handle is any position other than RESET.

The bucket can include a door latch that is attached to the first cam segment of the shutter cam and extends laterally outward from the shutter cam and that prevents the door latch from retracting if the operator handle is in any position other than RESET.

The door latch can include laterally spaced apart slots that engage first and second laterally spaced apart latch engagement features of the first cam segment of the shutter cam.

A curvilinear outer perimeter of the second cam segment can have a straight portion between two adjacent arcuate portions.

Other aspects of the invention are directed to a motor control center (MCC). The MCC includes: a cabinet housing with first and second sidewalls defining an enclosure with a plurality of compartments, the compartments configured to removably receive a plurality of units. At least one of the units includes: a unit housing having a front and opposing laterally spaced apart sidewalls that extend rearward of the front of the unit housing; an operator handle residing in front of the front panel and having an inwardly extending drive shaft; and a shutter cam attached to the drive shaft. The shutter cam includes a first cam segment and a second cam segment. The second cam segment is parallel with the first cam segment and is offset in a front to back direction of the unit housing to reside behind the first cam segment. The unit also includes a shutter in communication with the shutter cam, the at least one shutter having a primary body with a shutter portal and a laterally extending portion residing a lateral distance away from the shutter portal. The laterally extending portion has a downwardly extending segment residing between the first and second cam segments of the shutter cam and includes first and second laterally spaced apart outwardly projecting members. The unit also includes a laterally extending cabinet lock pin residing behind the shutter cam in the bucket housing, the laterally extending cabinet lock pin attached to an actuator rod that slidably moves the cabinet lock pin between engaged and disengaged positions. The actuator rod extends forward toward the operator handle a length sufficient to engage the second segment of the shutter cam and block the operator handle from rotating to an ON position as the first position when the cabinet lock is in the engaged position.

The downwardly extending portion of the shutter cam can include a planar vertically oriented segment that terminates above the drive shaft and is positioned longitudinally between the first and second cam segments of the shutter cam, the downwardly extending planar vertically oriented segment can include the first and second laterally spaced apart outwardly projecting members.

The first and second cam segments can be attached together. The first cam segment can have a curvilinear outer perimeter portion facing an adjacent longitudinally and laterally spaced apart curvilinear perimeter portion of the second cam segment.

The second cam segment can have a portion of the outer perimeter that is adjacent a portion of the outer perimeter of the first cam segment with a curvilinear gap space between the adjacent portions.

Optionally the shutter cam further includes at least one of: (i) a first forwardly projecting segment attached to the first cam segment and a second forwardly projecting segment attached to the second cam segment; (ii) at least one lug access aperture to thereby allow access to a phase A, B or C lug screw in an OFF position associated with non-conduction; and (iii) a planar rear surface with the second cam segment having an outer perimeter wall that is orthogonal to the planar rear surface and projects rearward a distance from the planar rear surface of the second cam segment.

The second cam segment of the shutter cam can also include a door interlock feature that releasably engages a spring-loaded arm to thereby block the shutter cam from rotating from OFF to ON when a door of the bucket is open, and wherein the first cam segment is attached to a door latch that slidably engages a cabinet door of the MCC cabinet housing to prevent the cabinet door from opening if the operator handle is any position other than RESET.

Further features, advantages and details of the present invention will be appreciated by those of ordinary skill in the art from a reading of the figures and the detailed description of the preferred embodiments that follow, such description being merely illustrative of the present invention.

It is noted that aspects of the invention described with respect to one embodiment, may be incorporated in a different embodiment although not specifically described relative thereto. That is, all embodiments and/or features of any embodiment can be combined in any way and/or combination. Applicant reserves the right to change any originally filed claim or file any new claim accordingly, including the right to be able to amend any originally filed claim to depend from and/or incorporate any feature of any other claim although not originally claimed in that manner These and other objects and/or aspects of the present invention are explained in detail in the specification set forth below.

BRIEF DESCRIPTION OF THE DRAWINGS

FIG. 7 is a front, side perspective view of a portion of a unit with a retractable power connector assembly and internal slidable shutter with the external cover over the racking (stab isolation) portal omitted according to embodiments of the present invention.

FIG. 9A shows the shutter positioned with a shutter portal providing access to the lead screw while FIG. 9B shows the shutter translated to block access according to embodiments of the present invention.

FIG. 10C corresponds to an on position. FIG. 10D illustrates an On to trip position/orientation.

DETAILED DESCRIPTION OF EMBODIMENTS OF THE INVENTION

Figure 1:
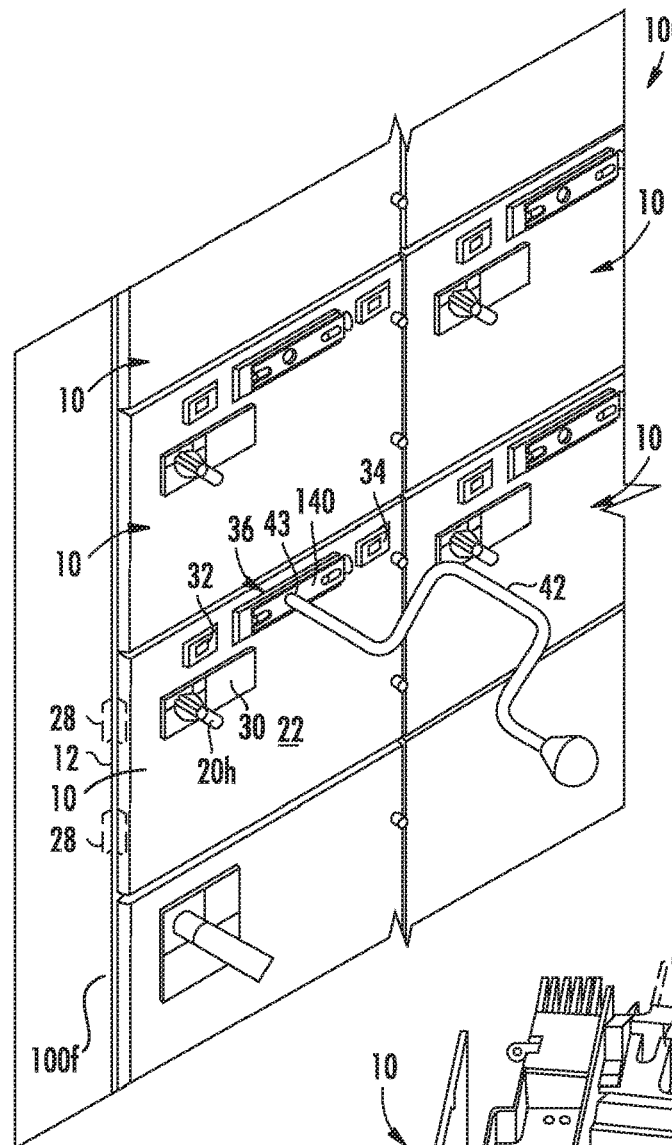
FIG. 1 is a partial front perspective view of an exemplary prior art Motor Control Center (MCC).

The present invention now will be described more fully hereinafter with reference to the accompanying drawings, in which illustrative embodiments of the invention are shown. Like numbers refer to like elements and different embodiments of like elements can be designated using a different number of superscript indicator apostrophes (e.g., 10, 10', 10", 10'").

In the drawings, the relative sizes of regions or features may be exaggerated for clarity. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90° or at other orientations) and the spatially relative descriptors used herein interpreted accordingly.

The term "about" refers to numbers in a range of +/−20% of the noted value.

As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

In the present disclosure, the terms "bucket" or "unit" are used interchangeably and are intended to mean a motor control center unit that may be configured to be a removable modular unit capable of being installed behind individual or combined sealed doors on the motor control center enclosure. The unit may contain various motor control and motor protection components such as motor controllers, starters, contactor assemblies, overload relays, circuit breakers, motor circuit protectors, various disconnects, and similar devices for electric motors. The unit is configured to connect to a common power bus of the motor control center and conduct supply power to the line side of the motor control devices for operation of motors or feeder circuits.

Figure 2:
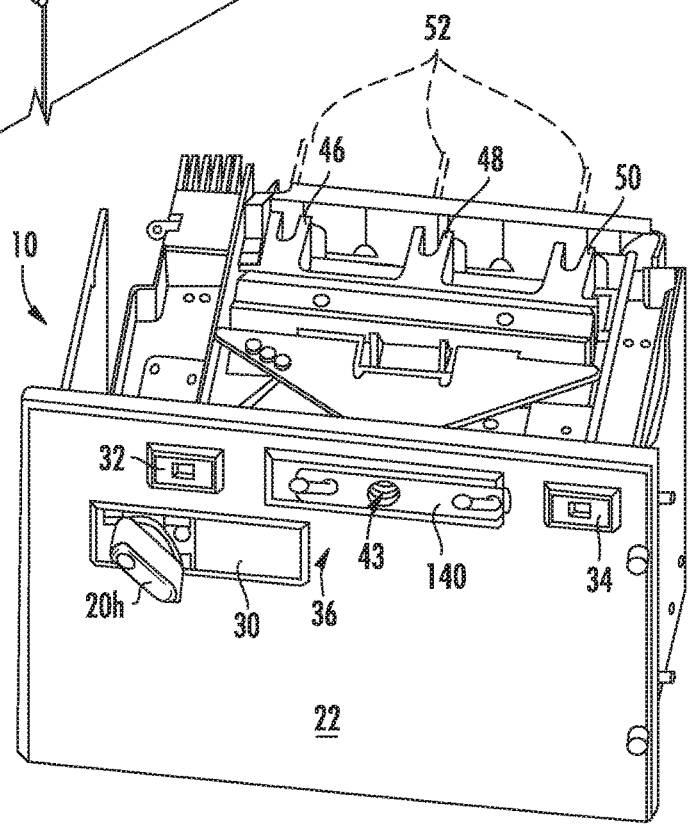
FIG. 2 is a top perspective view of an example of a prior art unit of the MCC.

As discussed before, units may be configured as "starter units" for supplying power to and/or controlling electrical motors and pumps or as general "feeder units" for supplying feeder circuits. The terms "bucket assembly", "bucket" and "unit" are used interchangeably and refer to a structure (typically having sides of a protective metal shell) that contains either a switch with a fuse or a circuit breaker for turning power ON and OFF to a motor, or feeder circuit, typically for controlling power to motor starters. As noted above, the bucket or unit can be a feeder unit or a starter unit. The bucket can include other components such as a power transformer, a motor starter to control a single motor and PLCs (programmable logic controllers), drives and the like. The bucket can be configured as a modular device to allow the internal components to be assembled as a unit that can be easily installed into a Motor Control Center (MCC) compartment. As is well known, the bucket 10 can have a bus grid with "power stabs" 46, 48, 50 (FIG. 2) in the back that connect to bus bars 52 (FIG. 2) that carry power (current) to the compartments of a vertical section in an MCC cabinet 100 (FIG. 1). The bus bars are connected to larger horizontal bus bars that bring power to the vertical sections. The horizontal bus bars are usually in the top, but some MCC designs may have them in the center or bottom.

A "feeder unit" refers to a motor control center unit for supplying feeder circuits. A feeder unit may have one or more feeders or power supply lines to supply feeder circuits or devices. A feeder unit (also called a "feeder") can have a "line side", which refers to the side of the feeder configured to be directly or indirectly connected to the common power bus of the motor control center. A feeder can also have a "load side", which refers to the side of the feeder configured to be connected to and deliver current to a feeder circuit. A feeder may comprise a circuit breaker, a fuse and disconnect switch, or another configuration. The terms "feeder circuit" and "feeder device" are used interchangeably and are intended to mean circuits or devices connected to feeder units or "feeders".

A "circuit breaker", "breaker", "molded case circuit breaker", or "MCCB" is a device designed to open and close a circuit, typically allowing both manual open and close operation and automatic circuit interruption, the latter to open a circuit under certain conditions, e.g., an over-current. The circuit breaker can be for a motor starter unit or feeder unit, for example.

The terms "motor", "load", and "load device" are used interchangeably and are intended to mean devices bearing electrical load that are connected to and controlled by the motor control center. Load devices are typically motors but may also be pumps or other machinery that may comprise motors or pumps. Load devices may be connected to starter units.

The terms "operating mechanism" and "operator mechanism" are used interchangeably and refer to an assembly for moving contacts in a switching mechanism between first and second positions in a circuit and/or for opening and closing separable main contacts, in a disconnect circuit such as a circuit breaker or for turning power ON and OFF using a switch associated with a fuse as a disconnect.

MCCs usually have a wire way for wires from respective units 10 to the motors and other loads and control wires. U.S. Patent Application Publication 2013/0077210 describes an MCC with both right and left side wireways, the contents of which are hereby incorporated by reference as if recited in full herein. The wireways are typically provided as an enclosed space in an MCC cabinet proximate but outside stacked units. MCCs can be configured in many ways. Each compartment can have a different height to accept different frame sizes of respective bucket assemblies or units 10, typically in about 6-inch increments. The vertical bus can be omitted or not run through the full height of the section to accommodate deeper buckets for larger items like variable frequency drives. The MCC can be a modular cabinet system for powering and controlling motors or feeder circuits. Several may be powered from main switchgear which, in turn, gets its power from a transformer attached to the incoming line from the power company. A typical MCC cabinet is an enclosure with a number of small doors arranged in rows and columns along the front. The back and sides are typically flat and mostly featureless. The buckets can be provided in varying sizes. For starter units, the size can be based on the size of the motor they are controlling. The bucket assembly can be configured to be relatively easily removable for repair, service or replacement. MCCs can have regular starters, reversing starters, soft start, and variable frequency drives. MCCs can be configured so that sections can be added for expansion if needed. The buckets or units 10 of a motor control center 100 can have the same or different configurations.

Figure 3:
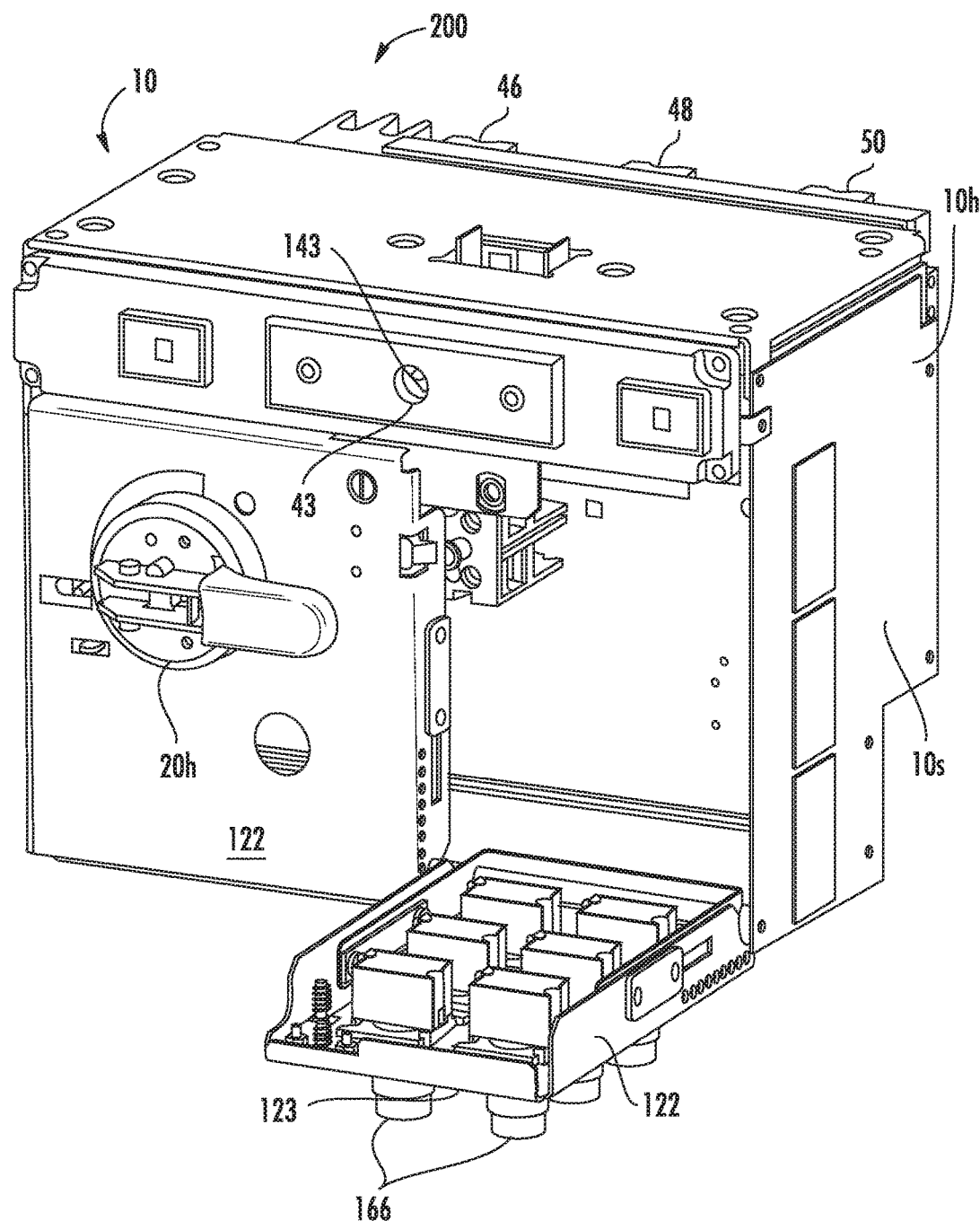
FIG. 3 is a front perspective view of an exemplary unit according to embodiments of the present invention.
Figure 4:
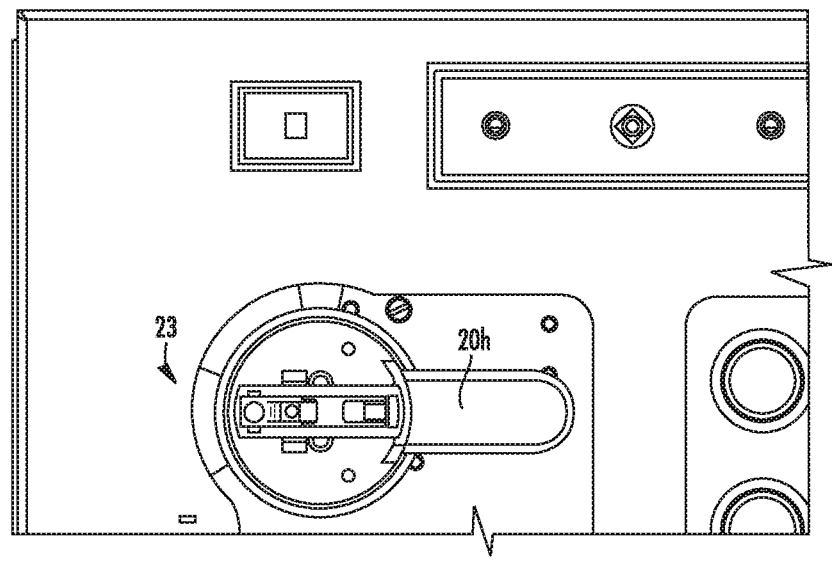
FIG. 4 is an enlarged partial front view of the unit shown in FIG. 3 according to embodiments of the present invention.
Figure 5:
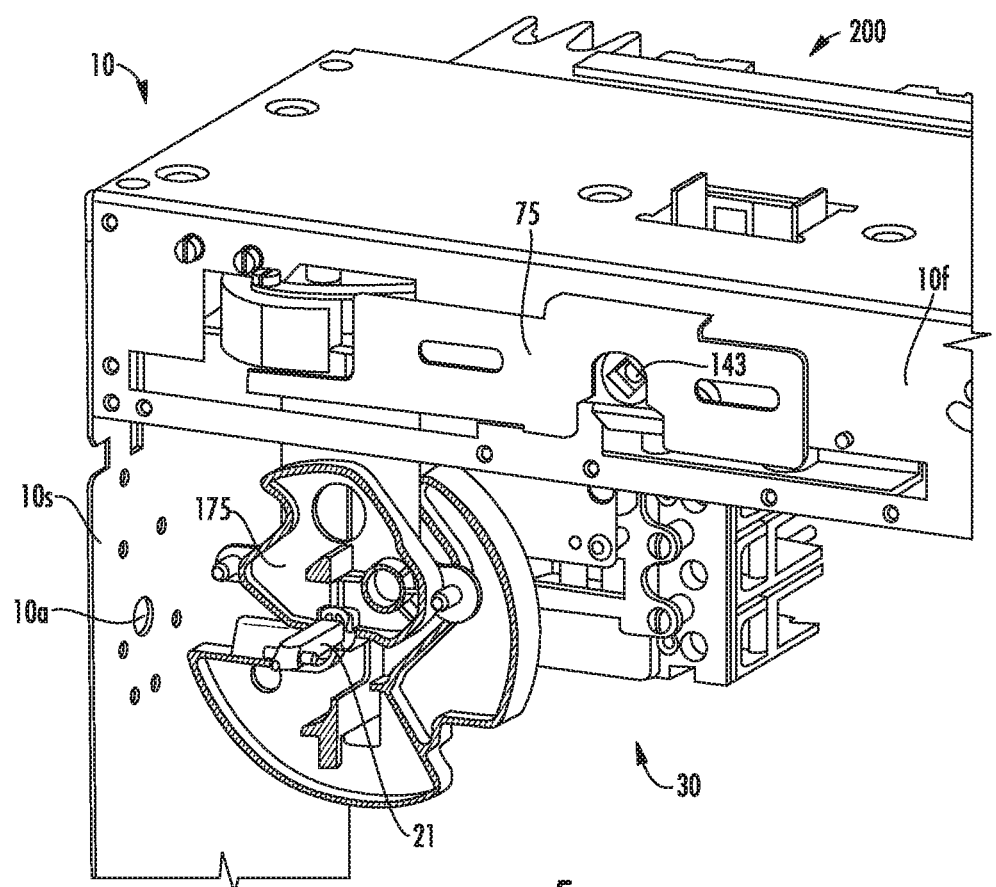
FIG. 5 is a partial side front view of the unit shown in FIGS. 3 and 4, shown without the front covers and handle according to embodiments of the present invention.

The terms "right side" and "left side" refer when the unit or MCC is viewed from the front, e.g., the front is associated with the unit 10 orientation shown in FIGS. 3 and 4, for example, with handles 20h facing forward as shown in FIGS. 3 and 4. While the handles 20h are shown as rotary handles, other handle configurations may be used, including, for example, push handles, levers and linearly moveable handles. It is also noted that the dual panel configuration shown in FIG. 3, one with a rotary handle 20h and one as a pilot panel, dual feed (dual handle) configurations can be used, typically with independently pivotable to open side by side arrangements. As shown in FIGS. 3 and 5, for example, the units 10 can have housings 10h with sidewalls 10s and a partial internal (typically metal) front wall 10f, sometimes also referred to as "top wrapper".

The term "compact" refers to units 10 held in a condensed configuration (package) relative to conventional units/buckets. The MCC structure or cabinet 100 (FIG. 1) can be designed to receive multiple bucket units 10 ranging in various defined sizes. The units 10 can be provided in package or frame sizes of about 6 inches to about 72 inches (tall) with substantially common depth and width dimensions, known as 1X (6 inches) to 12X (72 inches) sizes. The sizes can be in single X increments, from 1X, 2X, 3X, 4X, 5X, 6X, 7X, 8X, 9X, 10X, 11X and 12X. Thus, a 5X MCC unit 10 can be about 30 inches tall. The frame sizes can be provided for a plurality of amperages, including a plurality of: 125 A, 150 A, 225 A, 250 A, 400 A, 600 A, 1200 A and 2000 A, for example. A unit 10 is typically about 7 inches deep but larger or smaller sizes may be appropriate in some embodiments.

As shown in FIGS. 3, 4, 6A-6C, 9A, 9B, and 10A-10E, the bucket assembly or unit 10 includes a handle assembly 20a that cooperates with a shutter 75 and an operator mechanism 40 that engages the lever/toggle 35 of the switch assembly 30. The unit 10 also includes a retractable power connector assembly 200 with a lead screw 143 as will be discussed further below. The bucket assembly 10 can be configured for DC (direct current) or AC (alternating current) operation.

The handle assembly 20a can include a handle 20h (also referred to as a handle lever) 20h that is attached to an inwardly extending drive shaft 21 and that rotates between different positions associated with a state of the disconnect, typically at least first and second positions, and more typically, ON, OFF, TRIPPED and RESET positions although the TRIPPED position is not applicable for some unit configurations/disconnects.

The unit 10 can have a front panel 122 (under the cabinet door 22 of the MCC cabinet 100). The front panel can be configured as dual side by side panels 122 that can independently pivot out from the unit housing 10h as shown in FIG. 3, or may be single panel.

As shown in FIGS. 3 and 4, for example, visual indicia 23 (i.e., text) can be provided about a perimeter of the handle 20h identifying the position of the handle 20h relative to at least first and second status positions of the switch (i.e., ON, OFF status) of the unit 10.

As shown in FIG. 5, for example, the shaft 21 of the handle assembly 20a can be attached to a multi-purpose shutter cam 175 that is attached to the handle 20h via a shaft 21 to rotate in concert with the handle 20h. The drive shaft 21 is also attached to an operator mechanism 40, that is behind the multi-purpose cam 175 and in front of the disconnect assembly 30, as shown in FIGS. 5 and 6A-6C, for example.

The operator mechanism 40 can include a cooperating set of gears 45 (such as a drive gear, a pinion gear and a rack gear) that linearly move a slider 46 with an aperture 46a that receives and engages a lever 35 of the disconnect switch assembly 30 to move the lever 35 between at least first and second positions of different states of the switch/disconnect, i.e., between ON and OFF positions.

Figure 6A:
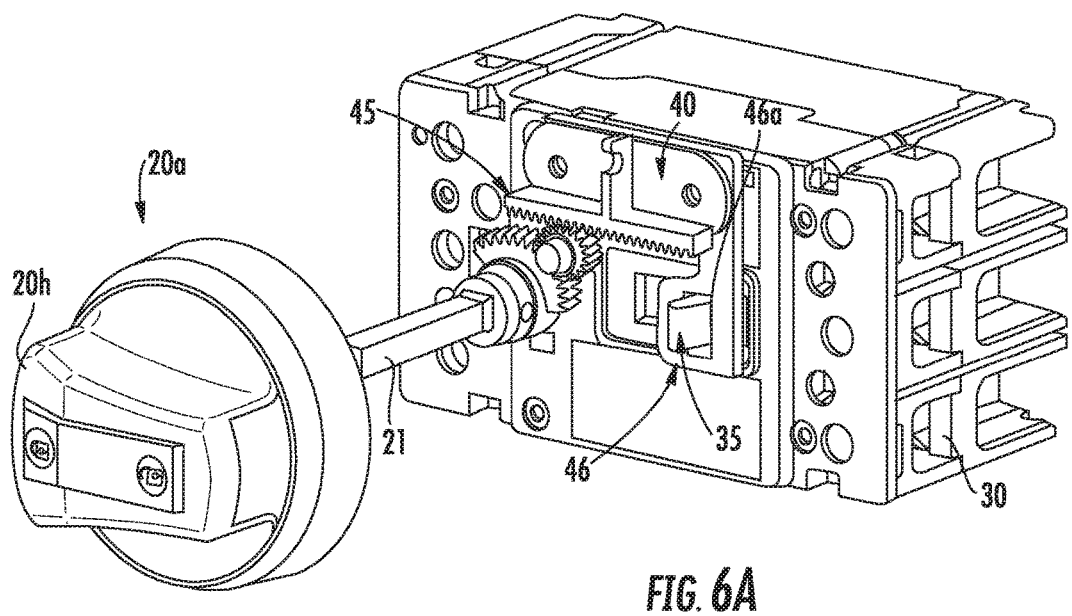
FIGS. 6A-6C are front perspective, partially exploded views of exemplary different positions of the handle in relationship to an associated internal disconnect assembly and disconnect, including "OFF" (FIG. 6A), "ON" (FIG. 6B) and TRIPPED (FIG. 6C) according to embodiments of the invention.
Figure 6B:
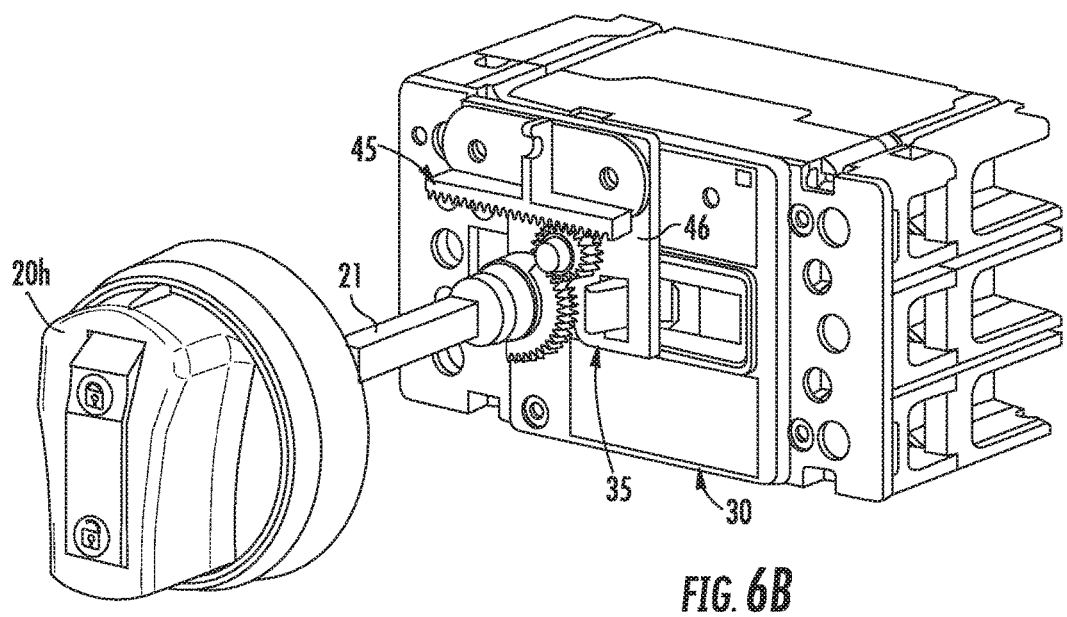

Referring to FIG. 6A, an exemplary position of the handle 20h and disconnect 30 in a first position, i.e., OFF position is shown. FIG. 6B shows an exemplary second position, i.e., ON position based on rotation of the handle 20h by about 90 degrees clockwise and the lever 35 then rotated to the second position, i.e., ON.

Figure 6C:
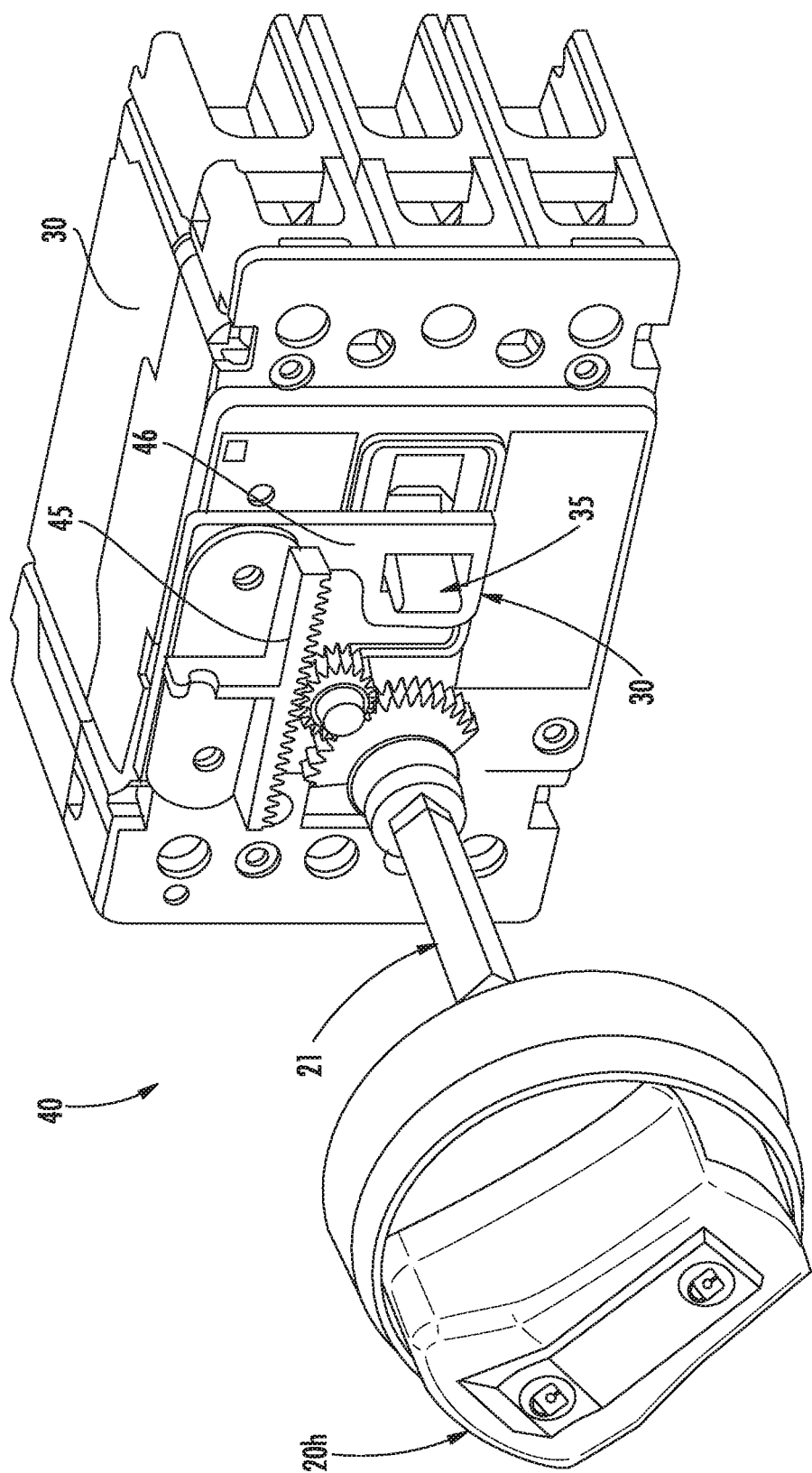

FIG. 6C shows that where a disconnect 30 is a breaker, if the breaker is in the ON position and trips, the lever 35 will rotate to a tripped position which drives the handle 20h to a tripped position as shown. For additional description of an example of an operator mechanism and components thereof, see, e.g., U.S. patent application Ser. No. 14/501,969, the contents of which are hereby incorporated by reference as if recited in full herein.

In operation, the pre-defined orientation of the rotary handle 20h with respect to operation status can provide a visual indication to a user-operator of the conduction status of the disconnect 30.

The term "ON" with respect to handle position/orientation refers to the associated feeder or starter of the unit 10 having conduction with the operator disconnect closed (circuit breaker closed or fused switch being ON/switch closed). The term "OFF" with respect to handle position/orientation refers to the associated feeder or starter of the unit 10 having no conduction with the disconnect open (circuit breaker open or disconnect switch OFF/switch open).

In some embodiments, if the handle 20h is in a generally horizontal position, i.e., with the center level straight across the front of the circuit breaker as shown in FIG. 4, this orientation can be the OFF position and can be visually used as an indication that the contacts of the circuit breaker are open and that current is blocked. If the handle 20h is rotated from the orientation shown in FIG. 4, e.g., rotated 90 degrees (typically clockwise from the orientation in FIG. 4), aligned with the visual indicia of ON, for example, then an indication is given that the circuit contacts are closed. Where the unit 10 includes a breaker as the disconnect 30, the breaker trip position can be at about 45 degrees mid-point between ON and OFF. However, as noted above, the handles 20h may have other configurations and are not required to be rotating handles and may use other angular orientations for ON and/or OFF.

As shown in FIGS. 3, 5, and 7, for example, the bucket assembly 10 can have a metal enclosure, frame or housing 10h with sidewalls 10s, and a metal ceiling 15. The metal ceiling 15 can extend down in a front direction to form a partial internal front upper wall 10f (the metal ceiling and partial front wall can also be referred to as a "top wrapper") that resides in front of the disconnect operator mechanism 40 and in front of the lever 35 of the disconnect assembly 30. The partial front wall 10f can terminate a distance above a bottom of a respective unit 10 and can be a shaped extension of the top/ceiling 15 or may be attached to the top/ceiling 15 as a separate component.

The shutter cam 175 can slidably attach to the partial front panel 10f and be in communication with at least one laterally slidable shutter 75 with a portal 75p. When the portal 75p is aligned with the isolation portal 43 and an internal lead screw with a socket 143 (FIGS. 7, 8A, 8B) external access to the portal 43 (FIGS. 1, 3) and the lead screw with socket 143 is allowed as will be discussed further below.

As shown in FIGS. 3, 7, 8A and 8B, the unit 10 can comprise a retractable power connector assembly 200 which allows the operator to extend and retract the power connects 46, 48, 50 by rotating a lead screw 143. In order for the bucket 10 to be either installed into or removed from the cabinet 100, the power connectors 46, 48, 50 must be in the retracted position which isolates the bucket 10 from the bus bars. See, U.S. Pat. Nos. 7,668,572; and 7,684,199, the contents of which are hereby incorporated by reference as if recited in full herein. The unit 10 also includes the at least one internal slidable shutter 75 with a portal 75p that can block external access to the lead screw 143.

Figure 8A:
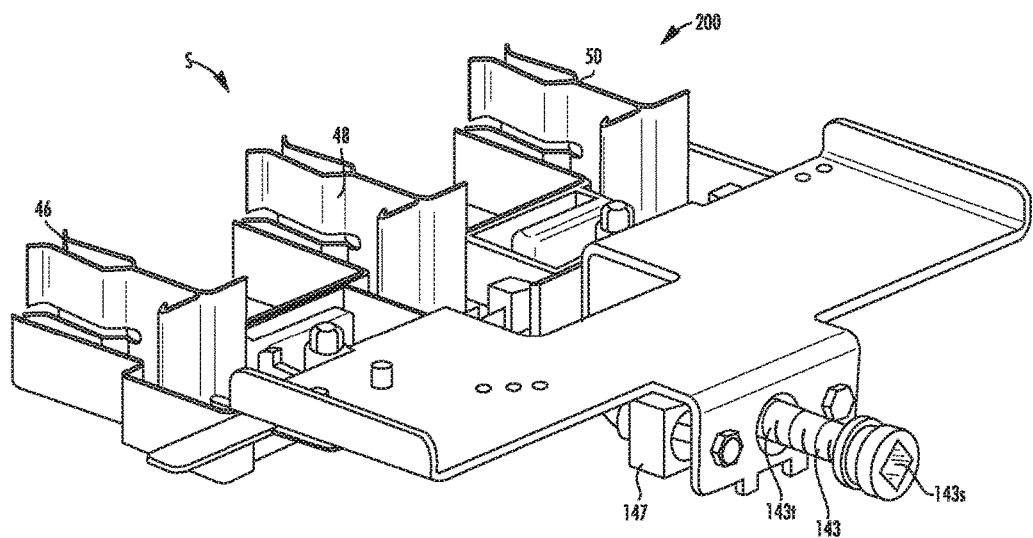
FIGS. 8A and 8B are front, side perspective views of the unit shown in FIG. 7 without the top cover illustrating a retractable stab configuration (FIG. 8A shows them partially retracted and FIG. 8B shows them fully extended) according to embodiments of the present invention.
Figure 8B:
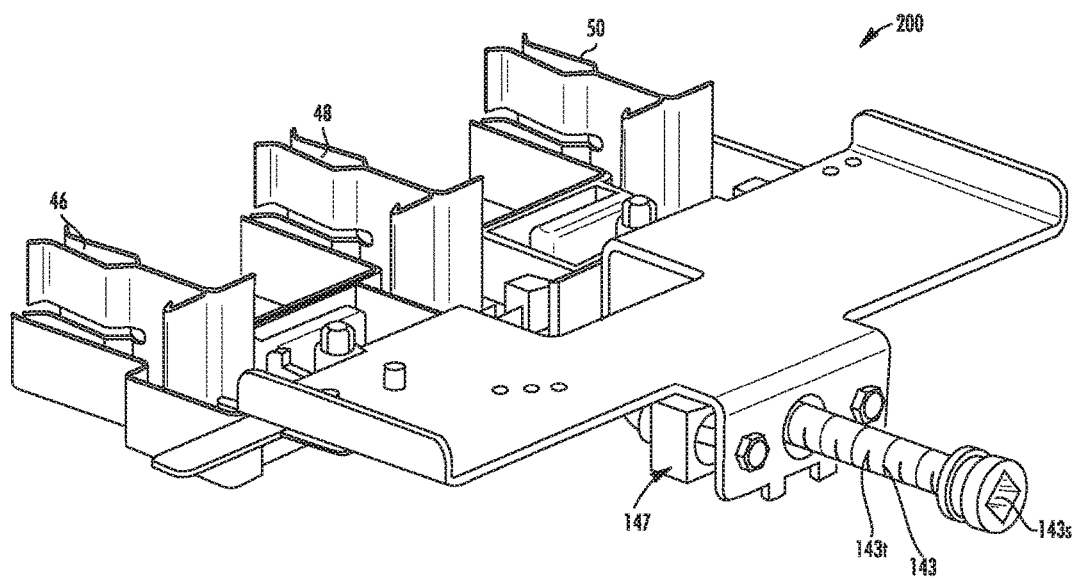

FIG. 8A shows a partially retracted position of the stabs S, i.e., power connectors 46, 48, 50, and FIG. 6B illustrates a fully extended position to illustrate the operation of extending the power connectors 46, 48, 50. A lead screw with a socket 143 is rotated clockwise which drives a nut 147 which is part of the assembly 200 that contains the power connectors 46, 48, 50 In the retracted position, the connectors 46, 48, 50 are not in contact with the bus bars (not shown). If the lead screw 143 with threaded shaft 143t and socket 143s continues to be rotated clockwise the power connectors 46, 48, 50 will eventually come into contact with the bus bars (not shown) when fully extended (FIG. 8B).

Figure 9A:
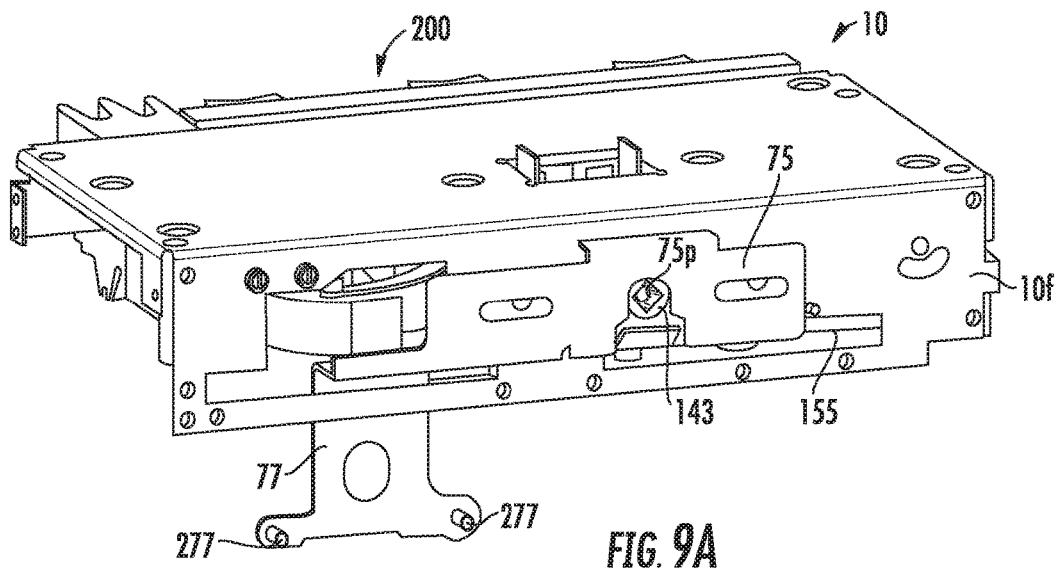
FIGS. 9A and 9B are front, side perspective views of a portion of a unit with a sliding shutter according to embodiments of the present invention.

The sliding shutter 75 provides a safety interlock to prevent the operator from accessing the lead screw socket 143s when the disconnect switch assembly 30 is in a first position, i.e., the ON state. When the disconnect switch assembly 30 (i.e., breaker) is in the OFF state the shutter 75 positions the shutter portal 75p over the socket 143s permits access to the socket 143s as shown in FIG. 9A. When the disconnect switch assembly 30 (i.e., breaker) is in the ON position, the shutter 75 slides to the right or left to a closed position which blocks access to the lead screw 143 and socket 143s as shown in FIG. 9B (shown as slid left to block access with the shutter portal 75p to the left of the lead screw 143 but a right to close or block sliding direction may be used).

Figure 9B:
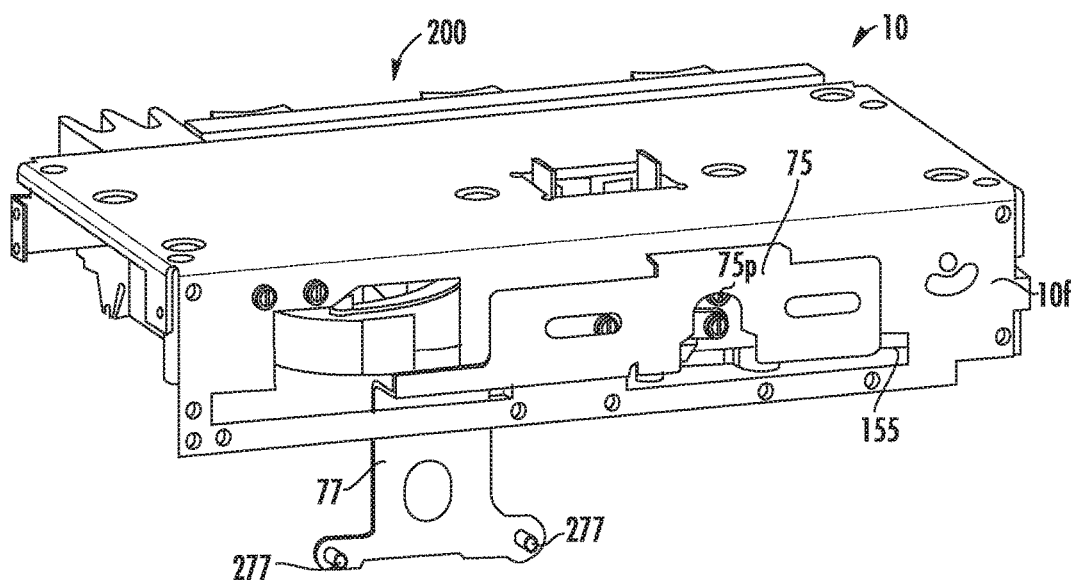

FIGS. 9A and 9B illustrate that the shutter 75 can have a primary body that is parallel to the partial front wall 10f. The lead screw 143 can extend out of an aperture in the partial front wall 10f. The partial front wall 10f can have at least one horizontally extending gap space or slot 155 that allows the shutter 75 to slide right and left in response to rotation of the shutter cam 175 (FIGS. 10A-10E). The partial front wall 10f can also have a portal 143p for the lead in screw 143 (FIGS. 7 and 8, for example).

Figure 10A:
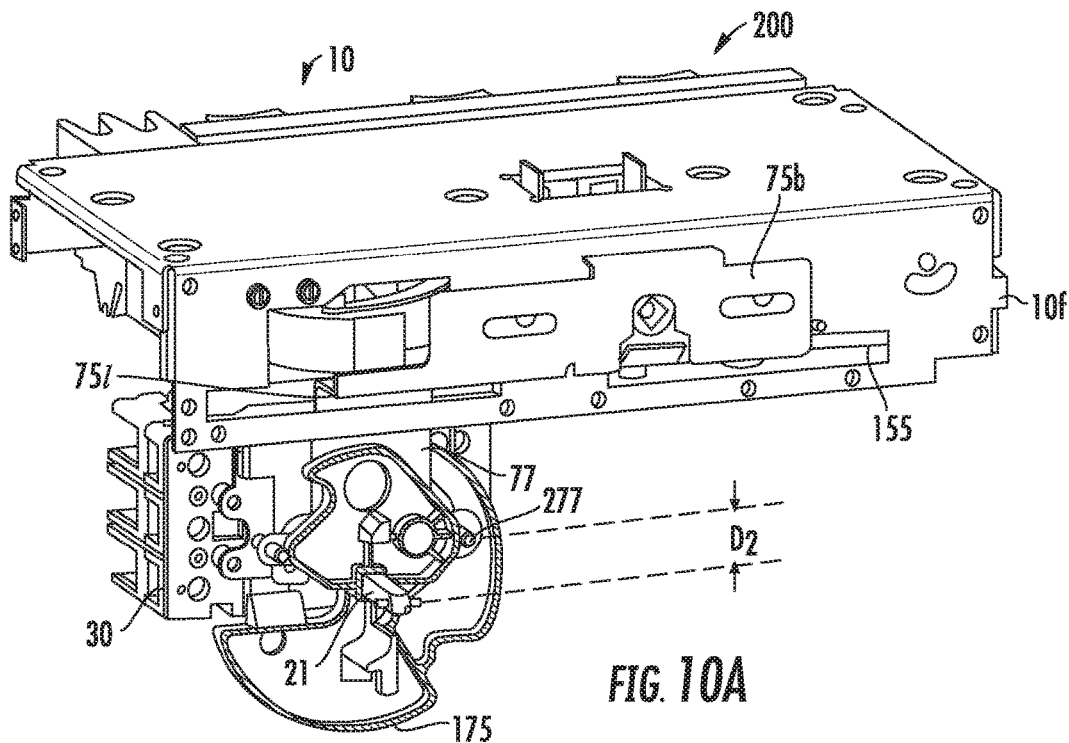
FIGS. 10A and 10B are front, side perspective view of a portion of a unit showing a sliding shutter and an exemplary multi-purpose cam in two different orientations/positions according to embodiments of the present invention.

Referring to FIG. 10A, the shutter 75 can have a primary body 75b with a lateral extension 75l that extends off a respective side of the shutter primary body 75b (shown as the left side in FIGS. 10A-10D). The extension 75 can have a downwardly extending (vertically oriented) segment 77 that holds outwardly projecting members (i.e., tabs) 277. The outwardly projecting members can be parallel to the axis of the drive shaft 21 and/or orthogonal to a plane of the primary body 75b of the shutter 75. The outwardly projecting members 277 can project toward the rotating handle 20h above the drive shaft 21, in some embodiments. The outwardly projecting members 277 can have a relatively short outward length, typically between about 0.1 inches to about 0.5 inches and can be laterally spaced apart a distance of between 1-3 inches.

Referring to FIGS. 9A and 9B, for example, the downwardly extending segment 77 can extend a distance below the shutter primary body 75b with the portal 75p. The downwardly extending segment 77 can be parallel to and/or coplanar with the primary body of the shutter 75b. As shown, the segment 77 is offset in a front to back direction of the unit 10 a distance of between about 0.1 inches to about 1 inch, more typically between about 0.1 inches and 0.25 inches and is typically positioned behind the primary body 75b of the shutter 75. The lateral extension 75 can be connected to the primary body 75b as a separate component or may be an integral component formed by molding or by metal bending/shaping.

Figure 10B:
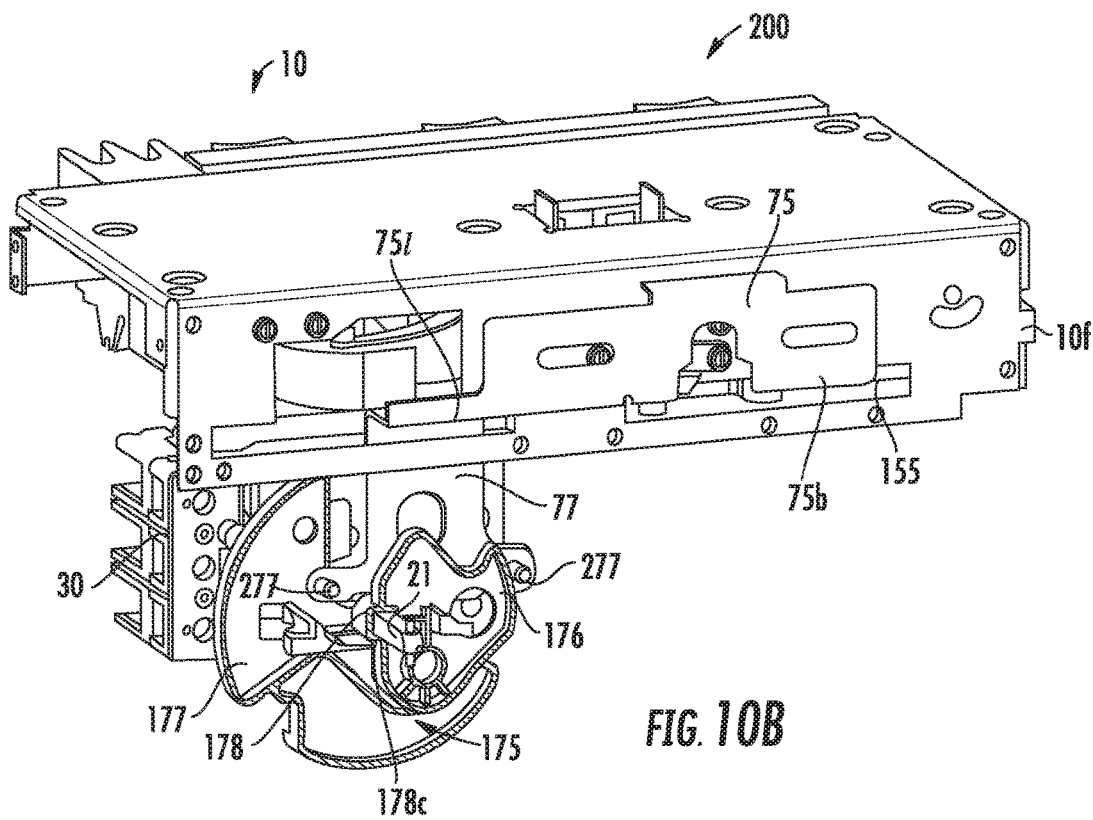
Figure 10C:
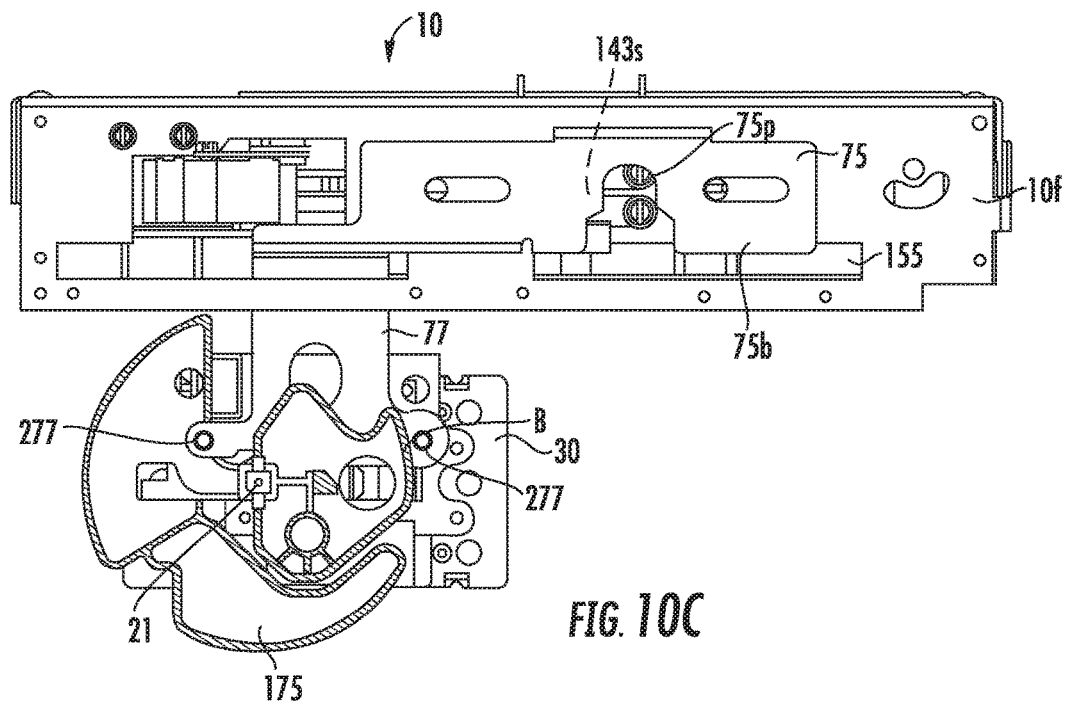
FIGS. 10C and 10D are front views of the portion of the unit shown in FIGS. 10A and 10B.
Figure 10D:
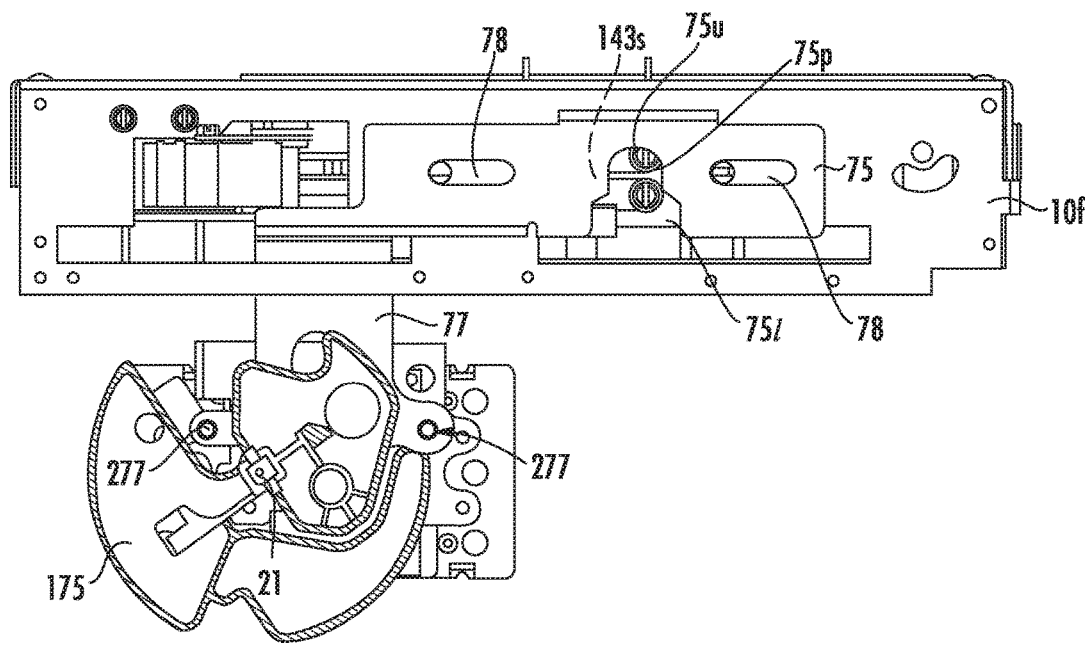
Figure 10E:
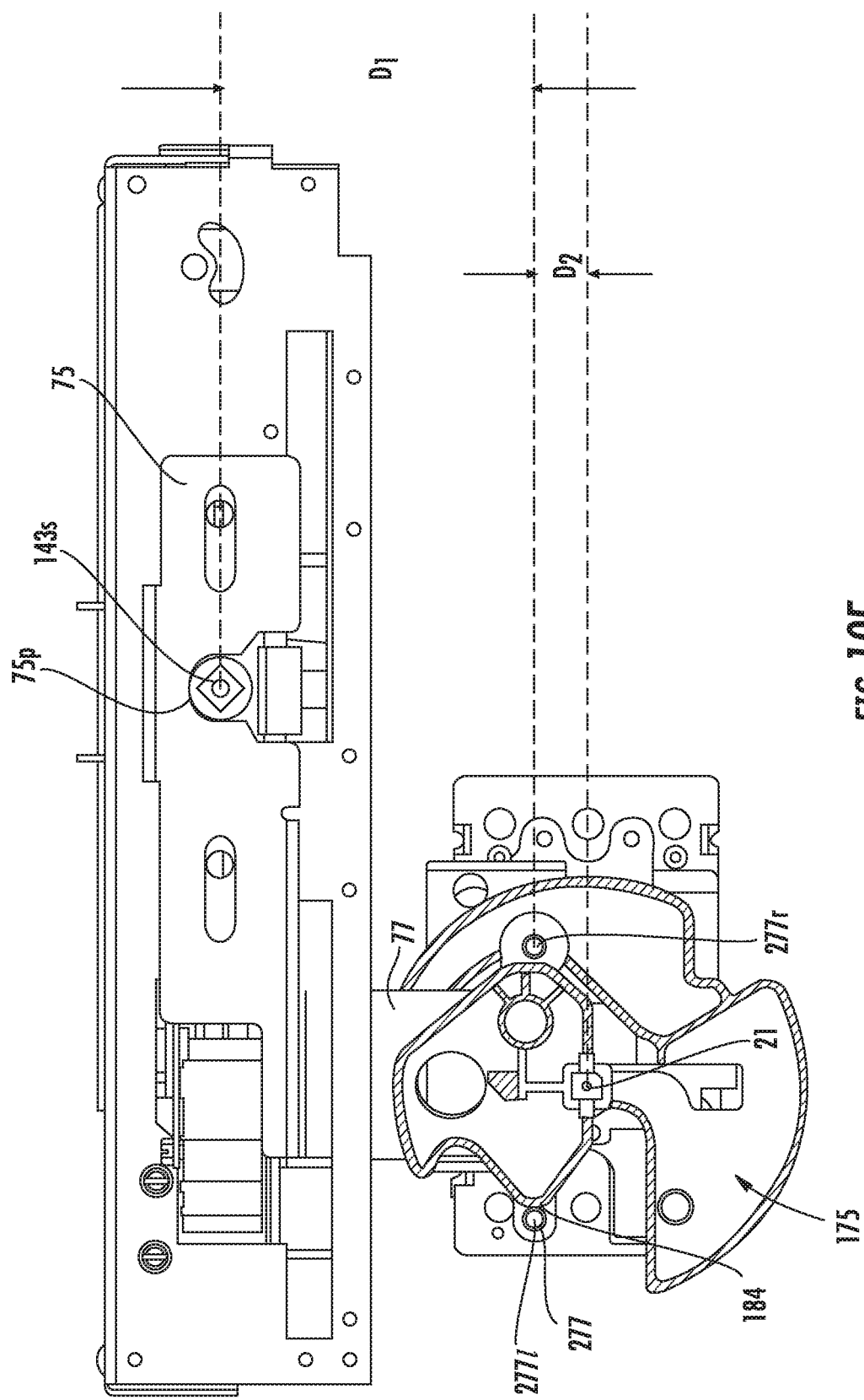
FIG. 10E is a front view of the portion of the unit shown in FIGS. 10A and 10B but illustrating the multi-purpose cam and shutter in a third position according to embodiments of the present invention.

Referring to FIG. 10E, the downwardly extending segment 77 can position the outwardly projecting members 277 a distance D1 below a centerline of the stab isolation socket 143s and/a distance D2 above the axially extending centerline of the drive shaft 21 with D1>D2. D1 can be between 3-6 inches and D2 can be between 0.25 and 2 inches.

The downwardly extending segment 77 holds a pair of laterally spaced apart outwardly projecting members (i.e. tabs) 277 that can serially engage different perimeter segments of the shutter cam 175 to move the shutter 75 right and left. The outer project members 277 are shown as extending toward the handle 20h and the shutter cam 175 is shown as residing in front of the shutter 75 but other arrangements can be used. For example, the shutter 75 or extension thereof 75l can reside in front of the shutter cam 175 and the outer projecting members 277 can project rearward.

FIGS. 10A-10E illustrate exemplary orientations of the shutter cam 175 and the shutter 75. FIG. 10A illustrates an exemplary OFF state orientation and position. As the handle 20h rotates clockwise, the shutter cam 175 drives the shutter 75 to the right. If the handle 20h rotates a sufficient angular amount clockwise, i.e., about 90 degrees as shown, the lever 35 is rotated to an ON position and the shutter 75 overlies the lead screw socket 143, .i.e., portal 75p is offset from the lead screw socket 143, so that the shutter is "closed" as shown in FIG. 10B.

FIG. 10C shows a front view of an exemplary ON position. As shown, the right side outwardly projecting member 277 is blocked by an adjacent surface "B" of the shutter cam 175 and prevents the shutter 75 from sliding left.

FIG. 10D shows that if the unit 10 is in the ON position and trips, the breaker lever 35 (FIG. 6C) will rotate to the tripped position which drives the shutter cam 175 to the tripped position. The shutter 75 does not move as the outwardly projecting members 277 do not engage the shutter cam 175.

FIG. 10E illustrates an ON to OFF operation where the handle 20*h* rotates counterclockwise from the ON position to the OFF position causes the lever 35 to rotate toward the OFF position. If the handle 20*h* rotates about 90 degrees counterclockwise, the lever 35 (FIGS. 6A-6C) will reach the breaker OFF position and the cam shutter 175 will drive the shutter 75 to the left by contacting the left outwardly projecting member 277*i* (while the right outwardly projecting member 277*r* is laterally spaced apart from an adjacent cam surface) as shown. The socket 143*s* is now exposed as aligned with the shutter portal 75*p* of the shutter 75.

Referring to FIG. 10D, the shutter portal 75*p* can have an arcuate upper end portion 75*u* that merges into a wider open space 75*l* at a bottom thereof and the perimeter shape of the portal may have sidewalls that are parallel and straight at the bottom end portion under the arcuate upper portion. The shutter may include elongate horizontal slots 78 that slidably attach to the front partial wall 10*f*.

Referring again to FIG. 10B, the multi-purpose shutter cam 175 can include a first segment 176 that selectively, serially, engages right and left side outwardly extending (also termed outwardly projecting) members 277 to slide the shutter right and left as discussed above and a second segment 177. The first segment 176 can reside in front of the second segment 177, closer to the handle 20*h*, and the downwardly extending segment 77 can be planar and reside between the first and second segments 176, 177 of the multi-purpose cam 175 to position the outwardly projecting members 277 in front of the second segment 177. The two segments 176, 177 can be connected by a neck 178 that has an axially extending channel 178*c* that receives the shaft 21. The two segments 176, 177 can be coplanar, but are typically parallel and reside in different planes that are spaced apart, longitudinally, associated with a front to back direction, in the unit 10 a distance from about 0.1 inches to about 1 inch, more typically from about 0.25 inches to about 0.75 inches.

The first segment 176 and the second segment 177 can be separate components held by the shaft 21 and can rotate in concert (both being affixed to the shaft 21 directly or indirectly) or may be a single piece, monolithic three-dimensional component.

Referring to FIGS. 11A-11E, the cam shutter 175 can be a single piece relatively complex 3-D shaped member that is attached to the handle drive shaft 21. The first segment 176 that drives the shutter 75 can be parallel to the second segment 177 and can reside closer to the handle 20*h* and/or front of the unit than the second segment 177.

Figure 11A:
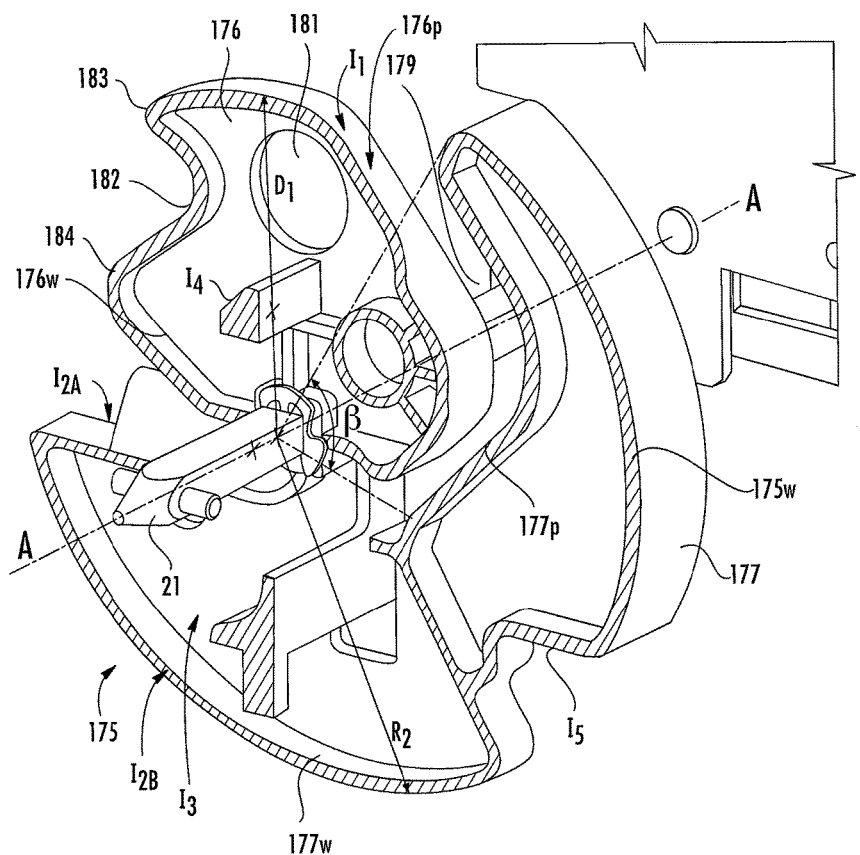
FIG. 11A is a front, side perspective view of the exemplary multi-purpose shutter cam on the handle drive shaft, shown without the handle, according to embodiments of the present invention.
Figure 11B:
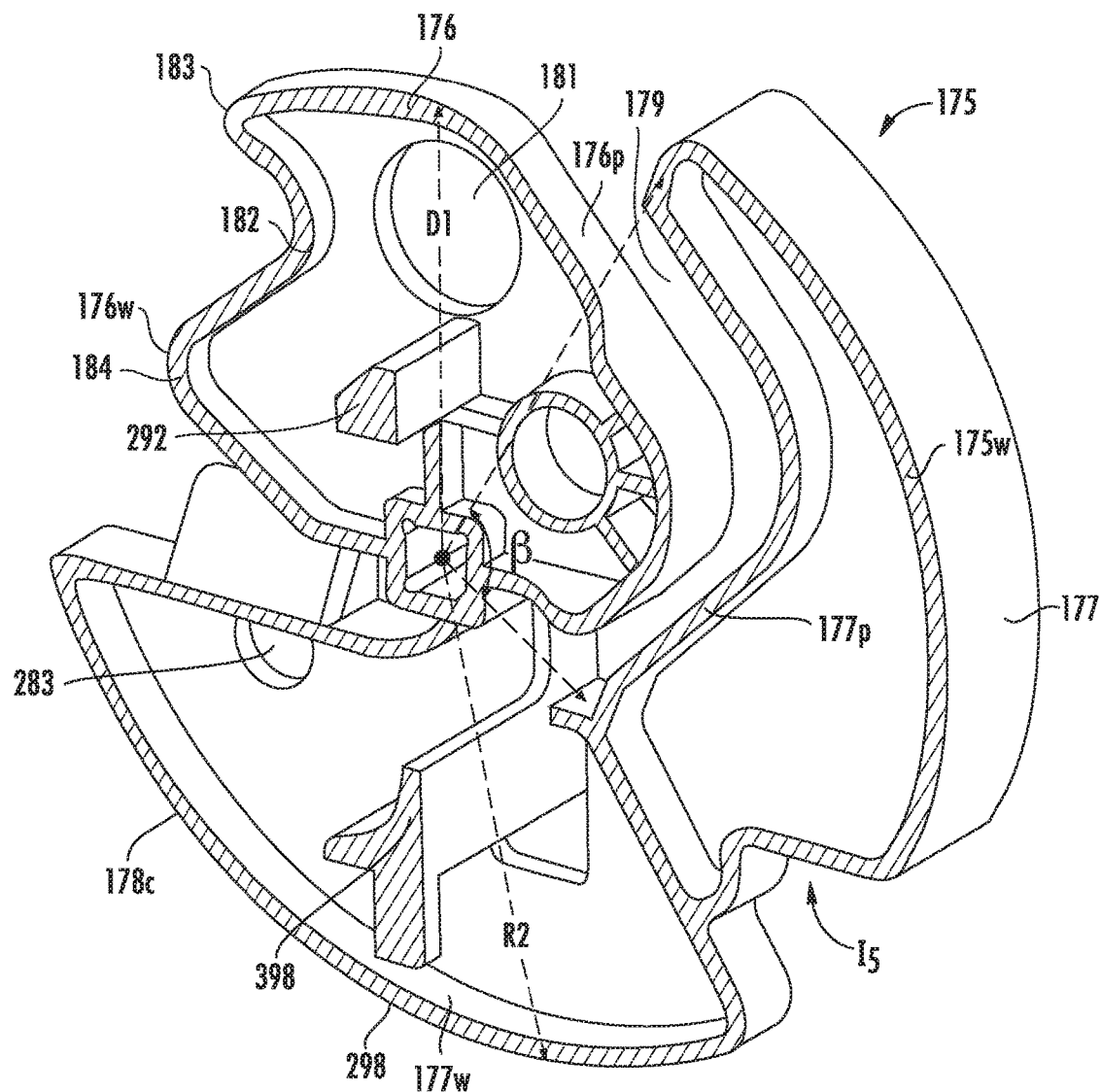
FIG. 11B is a front, side perspective view of the shutter cam shown in FIG. 11A according to embodiments of the present invention.
Figure 11C:
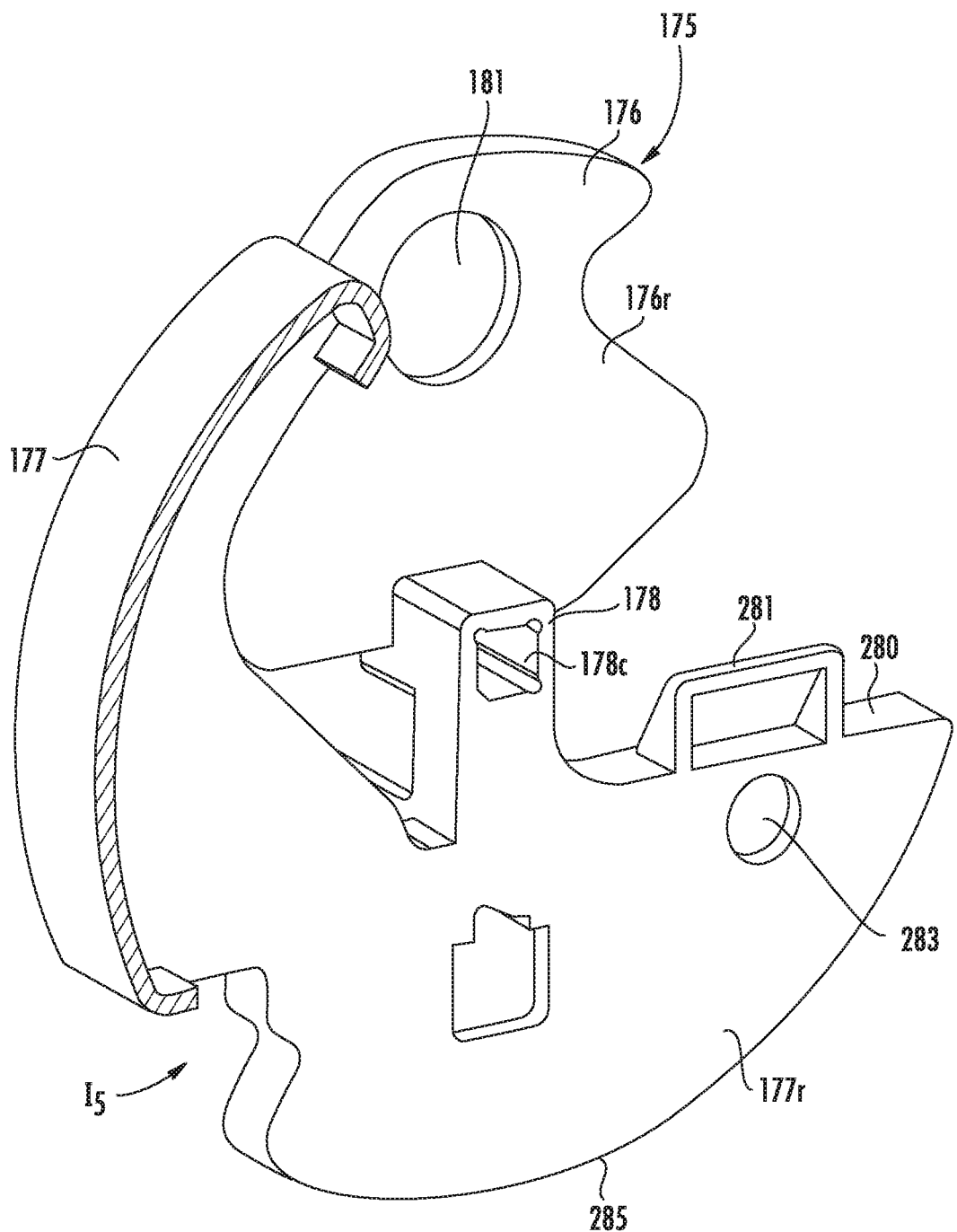
FIG. 11C is a rear, side perspective view of the shutter cam shown in FIG. 11B according to embodiments of the present invention.
Figure 11D:
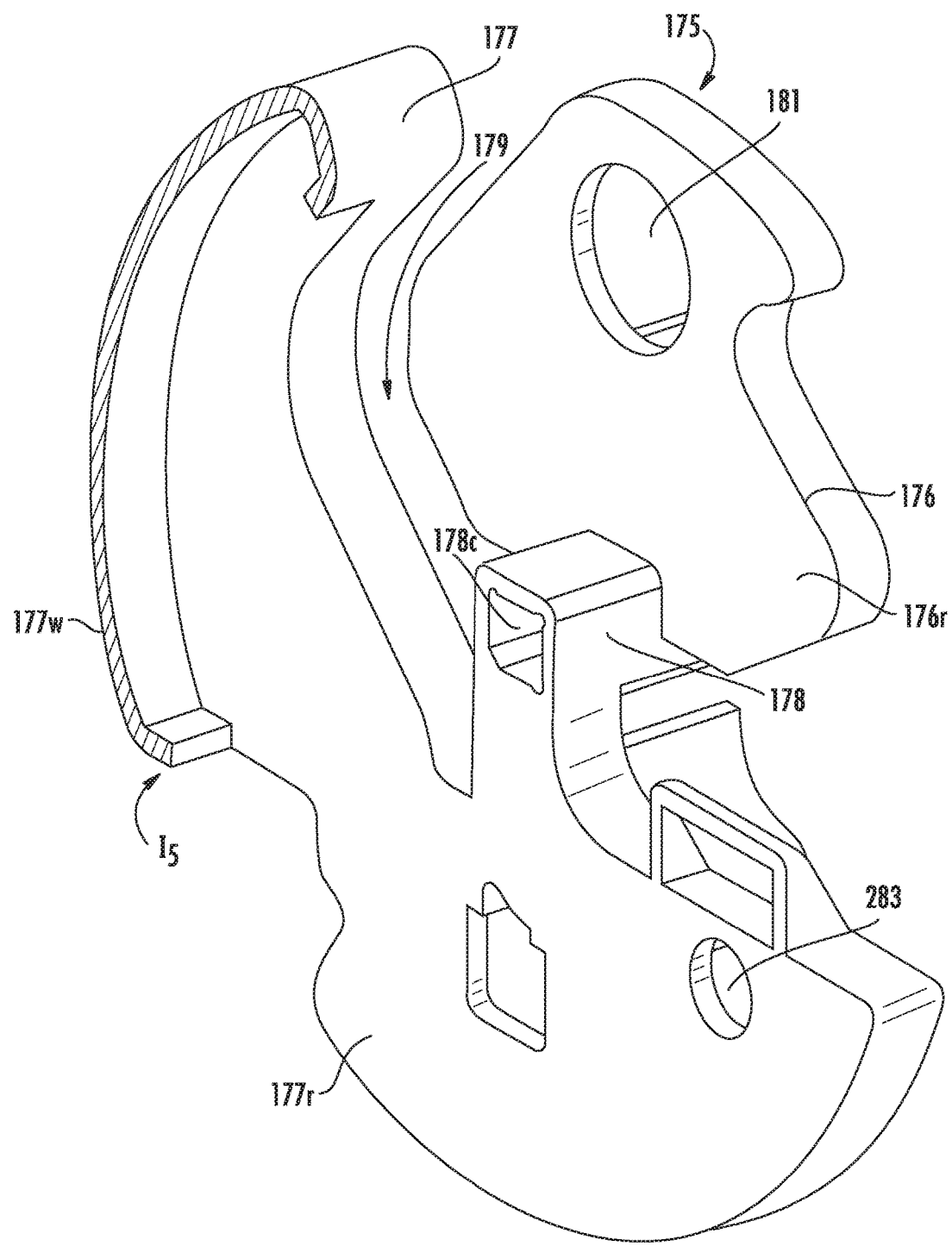
FIG. 11D is another rear, side perspective view of the shutter cam shown in FIG. 11B according to embodiments of the present invention.

As shown in FIGS. 11C and 11D, the first segment 176 can have a planar rear surface 176*r* and the second segment can have a planar rear surface 177*r*. As shown, for example, in FIG. 11E, the rear surface 176*r* of the first segment can reside in front of the rear surface 177*r* of the second segment. The second segment 177 can also have a curvilinear outer perimeter wall 177*w* that projects orthogonal to and rearward a distance from the planar rear wall 177*r*. The curvilinear outer perimeter wall 177*w* can reside aligned with but laterally spaced apart from the gap space 179.

Figure 11E:
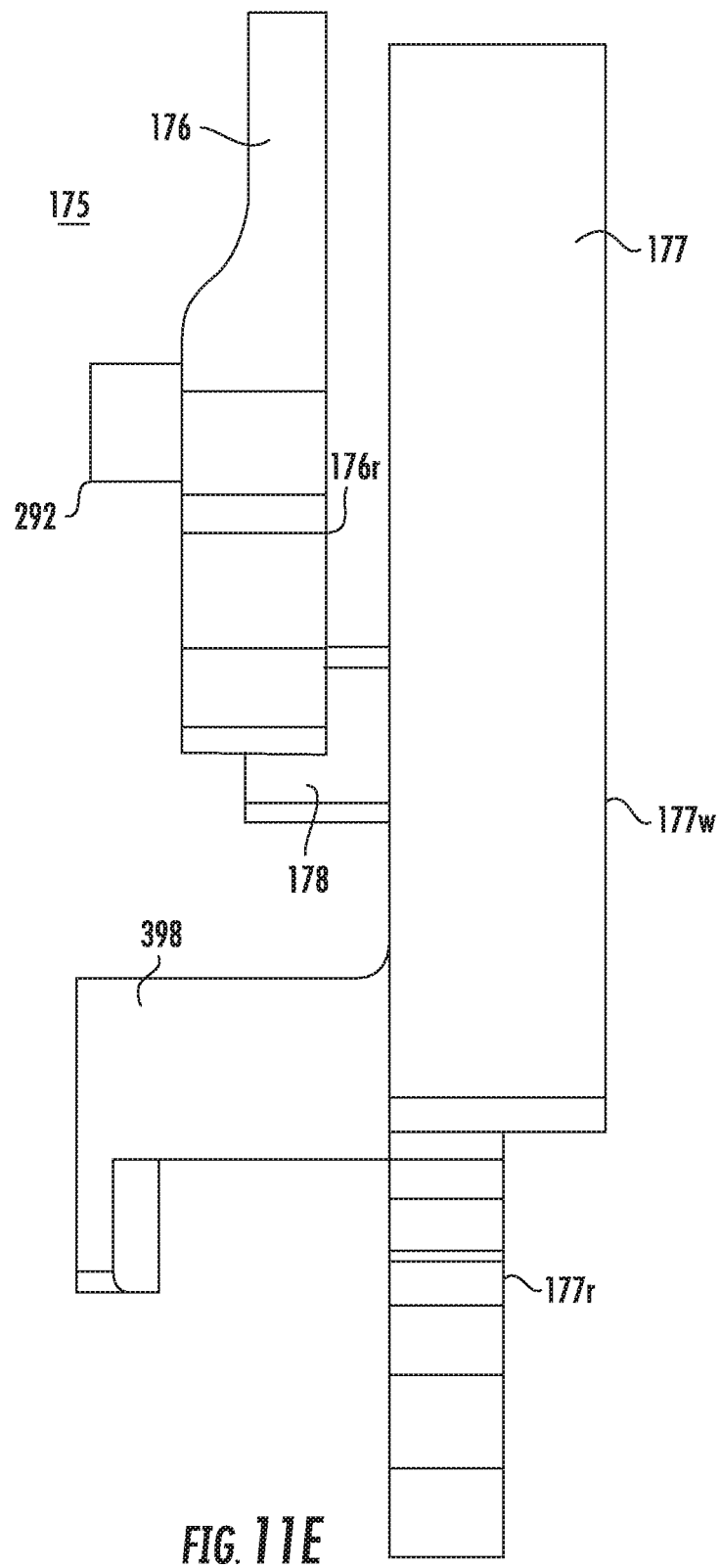
FIG. 11E is a right side view of the shutter cam shown in FIG. 11B according to embodiments of the present invention.

The cam 175 can comprise a first outwardly projecting segment 292 (extending toward the handle 20*h*) attached to the first segment 176 and a second outwardly projecting segment 398 (extending toward the handle 20*h*) that can extend more forward than the first segment 176 and the first projecting segment 292 and is attached to the second segment 177 (FIG. 11E).

As shown in FIGS. 11A and 11B, the first segment 176 can have a maximal distance $D_1$ that is less than a maximal radius $R_2$ of the second segment 177.

Figure 14:
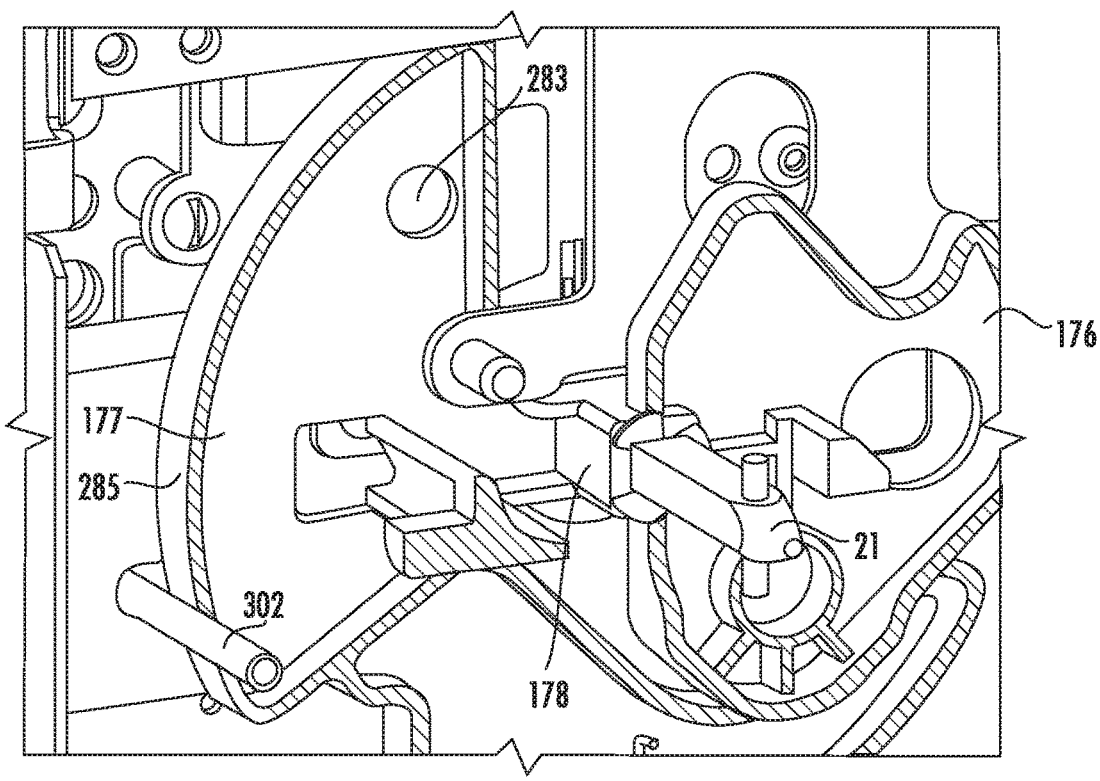
FIG. 14 is a partial side, front perspective view of the multi-purpose cam and cabinet interlock shown in FIGS. 13A and 13B with the multi-purpose cam rotated to an ON position which positions a segment of the cam to block the interlock pin in the locked position according to embodiments of the present invention.

The first segment 176 can have an outer perimeter with a first end portion that resides closer to the shaft 21 than the remainder of its body and/or is secured to the shaft 21 such as via neck member 178 (FIGS. 10, 14).

The first segment 176 can reside entirely on one side of a line drawn laterally through the shaft 21, perpendicular to the axis A-A of the axially extending centerline of the shaft 21, while the second segment 177 can have a greater angular extent.

The second segment 177 can have an inner perimeter 177*p* that is curvilinear and that is adjacent an outer curvilinear perimeter of the first segment 176*p*. The inner perimeter of the second segment 177 can be spaced apart from the outer perimeter of the first segment 176 with a curvilinear gap space 179 therebetween. The curvilinear inner perimeter 177*p* of the second segment with the curvilinear gap space 179 can have a circumferential angular extent "β" measured from a center of the shaft 21, that is between 90-270 degrees, more typically between 100-180 degrees.

The multi-purpose cam 175 can have outwardly projecting end walls 175*w* that are parallel to the axial extending centerline of the shaft A-A. The outwardly projecting walls 175*w* can reside on both the first segment as first segment outer walls 176*w* and the second segment as second segment outer facing walls 177*w*.

The shutter cam 175 can include one or more lug screw access apertures or windows, shown as apertures 181, 283.

The first segment 176 can have an open (typically circular) window 181 that can provide access to one of the breaker lugs (i.e., access to a phase B lug screw) when a vertically oriented breaker is used. The second segment 177 can have an access aperture 283 that allows access to a phase C lug screw Ls (FIG. 13C) in an OFF position.

The first segment 176 can have a valley 182 between nodes or peaks 183, 184 across from the curvilinear gap space 179.

The multi-purpose cam 175 can have interlock features $I_3$, $I_4$ that are parallel to an axial extending centerline A-A of the shaft 21 and extend toward the handle 20*h*, one interlock feature $I_4$ above and one interlock feature $I_3$ below the shaft 21 in the orientation of the shutter cam shown in FIG. 11A. Each of these interlock features $I_3$, $I_4$ can have at least one flat surface.

The multi-purpose cam 175 can have a curvilinear perimeter and a plurality of different spaced apart shaped interlock features such as, for example, a plurality or all of $I_1$, $I_{2A}$, $I_{2b}$, $I_3$, $I_4$ and $I_5$, as will be discussed further below Interlock 1—Drive Socket Access and Block Referring to FIG. 10E, the shutter cam 175 provides a first interlock using a peak 184 of the first segment 176 to move the shutter 75 so that the drive socket 143*s* is accessible when the handle 20*h* is in the OFF or RESET position and the first segment also moves the shutter in the opposing direction so that the drive socket 143*s* is inaccessible when the handle 20*h* is in the ON or RESET position. In the handle OFF position, the shutter cam 175 positions the shutter 75 such that the drive socket 143s is accessible. In this position, the drive socket 143s can be rotated clockwise to engage the stabs S with the cabinet bus bars (bucket energized) or counterclockwise to disengage the stabs S (bucket not energized). As shown in FIG. 10C, in the handle ON position (bucket energized) the first segment 176 of the shutter cam 175 positions the shutter such that the drive socket 143s is inaccessible and blocks the shutter from being able to slide left which provides the interlock of not being able to disengage the stabs S from the bus bars when the bucket is energized.

Interlock 2A—Cabinet Interlock Detection

Figure 12A:
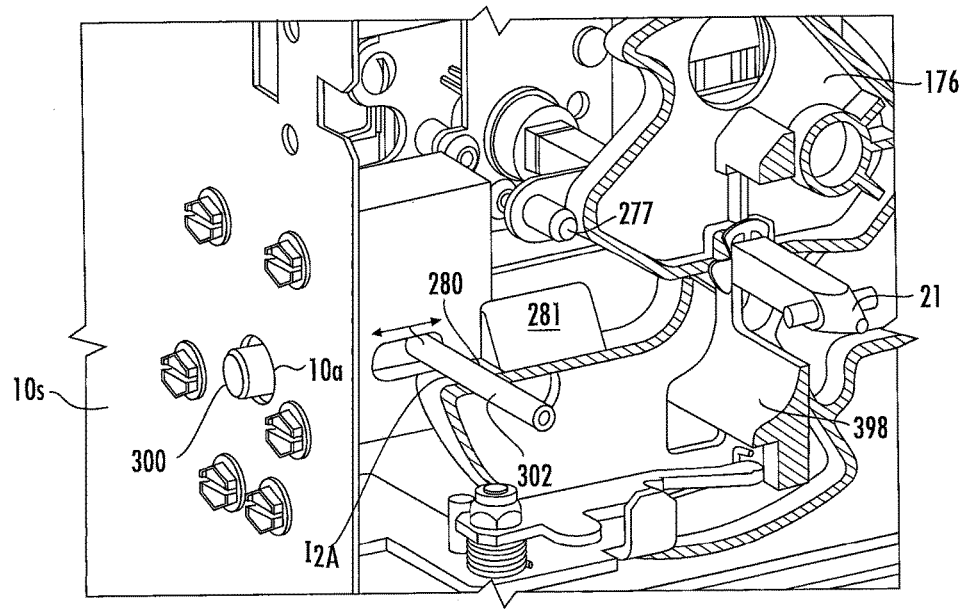
FIG. 12A is a partial side, front perspective view of the multi-purpose cam in position in a unit and cooperably engaged with a cabinet interlock according to embodiments of the present invention (shown in a disengaged/unlocked position).
Figure 12B:
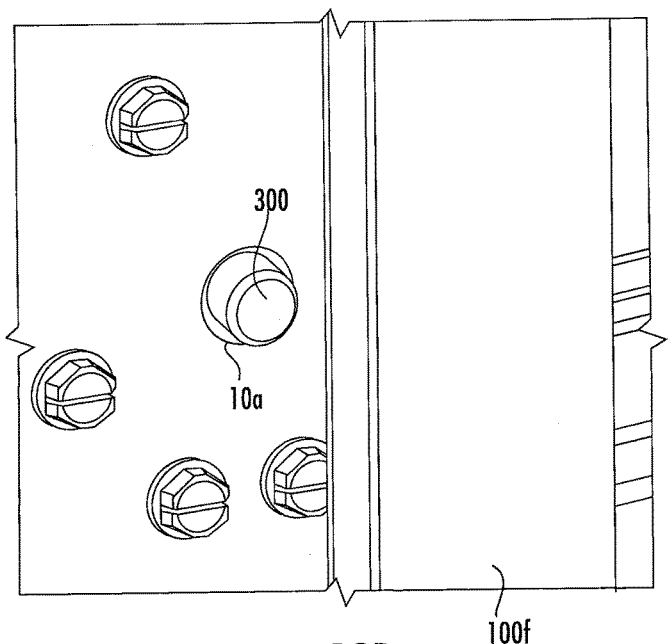
FIG. 12B is an enlarged partial side view of the unit shown in FIG. 12A with the cabinet interlock in a disengaged position with respect to a cabinet according to embodiments of the present invention.

Referring to FIGS. 12A and 12B, another interlock $I_{2A}$ can be provided so that the handle 20h cannot be rotated to the ON position unless the cabinet interlock 300 is engaged. The bucket 10 can have a (typically manually) actuated cabinet interlock 300 which is used to secure the bucket 10 in the cabinet 100. The cabinet to unit interlock 300 can comprise a laterally extending lock pin 300 that can be engaged by sliding a shaft 302 (also called an actuator rod, pin or bar) that can be orthogonal to and is attached to the lock pin 300 inside the unit 10 and the unit housing 10h behind the cabinet frame 100f. The lock pin 300 can laterally extend and retract a distance relative to an aperture 10a in the sidewall 10s of the unit 10. The disengaged (unlocked) position is shown in FIGS. 12A and 12B.

As shown, the second segment 177 of the shutter cam 175 has a flat surface 280 that aligns with the shaft 302 and an adjacent blocking member 281 that resides closer to the shaft 21 and extends a distance above the flat surface 280 (in the orientation shown). The flat surface 280 can merge into an adjacent arcuate outer perimeter 285.

Figure 13A:
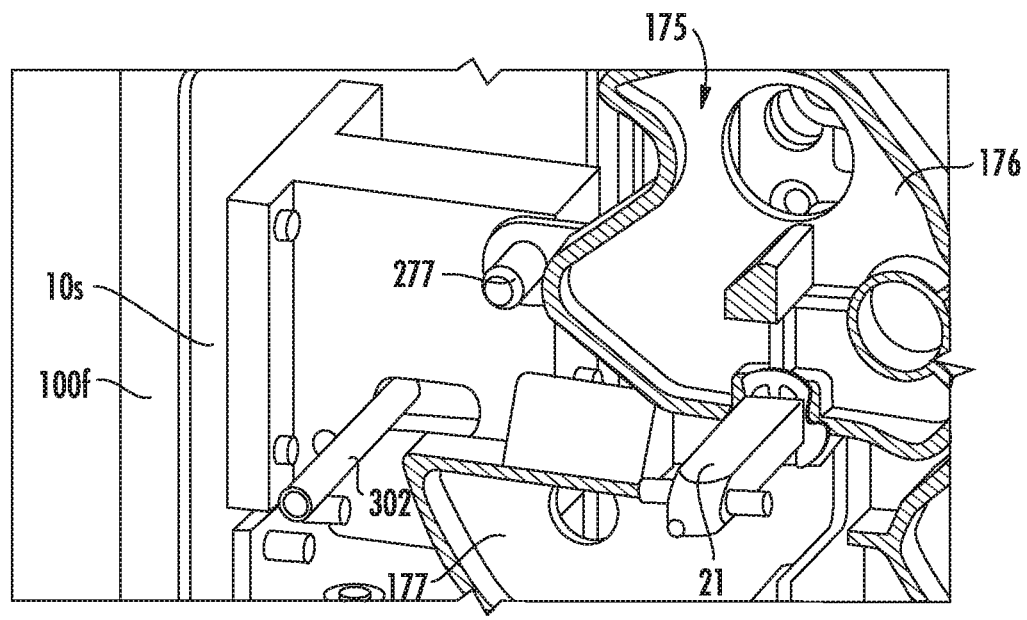
FIG. 13A is a partial side, front perspective view of the multi-purpose cam in position in a unit and cooperably engaged with the cabinet interlock shown in FIGS. 12A and 12B according to embodiments of the present invention (shown in an engaged/locked position).
Figure 13B:
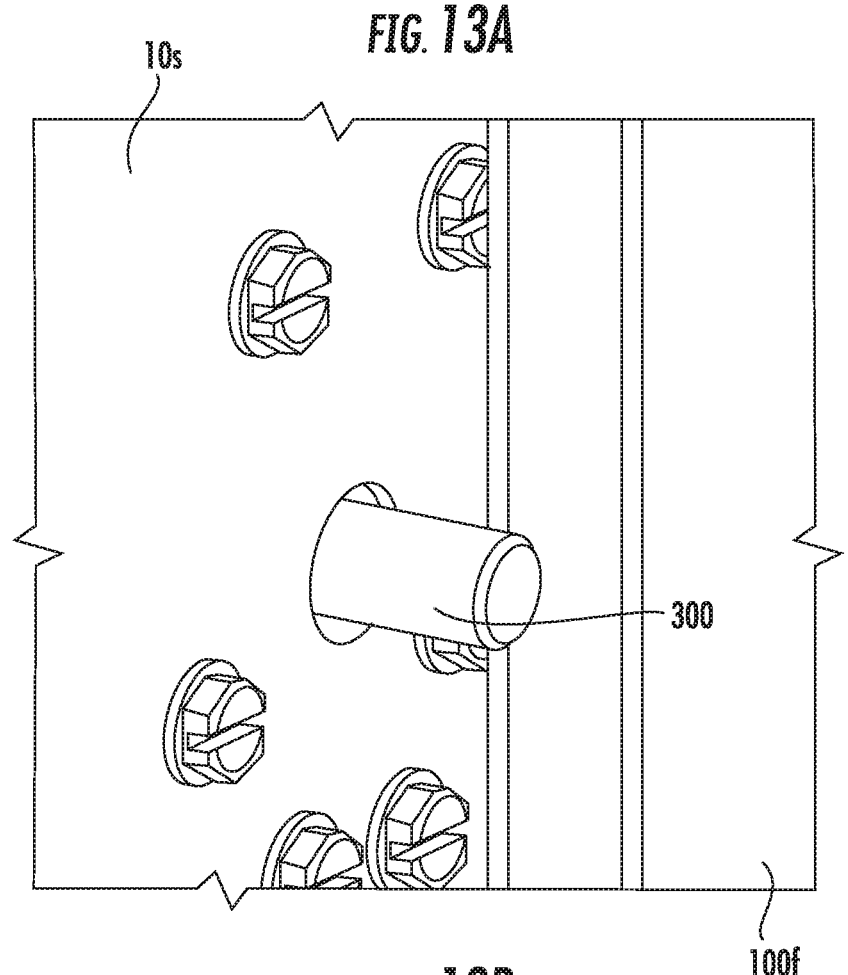
FIG. 13B is an enlarged partial side view of the unit shown in FIG. 13A with the cabinet interlock in the engaged position with respect to the cabinet according to embodiments of the present invention.

FIGS. 13A and 13B illustrate an engaged position. The shaft 302 is slid to the left such that the lock pin 300 is extended further out relative the position in FIGS. 12A and 12B and is positioned behind the cabinet frame or post 100f. This interlock 300 is disengaged (retracted) in order to insert or remove the bucket 10 from the cabinet 100. The handle 20h must be in the OFF or RESET position in order to engage or disengage the cabinet interlock. The handle 20h is prevented from rotating to the ON position unless the cabinet interlock 300 is engaged using this interlock $I_{2A}$.

Figure 13C:
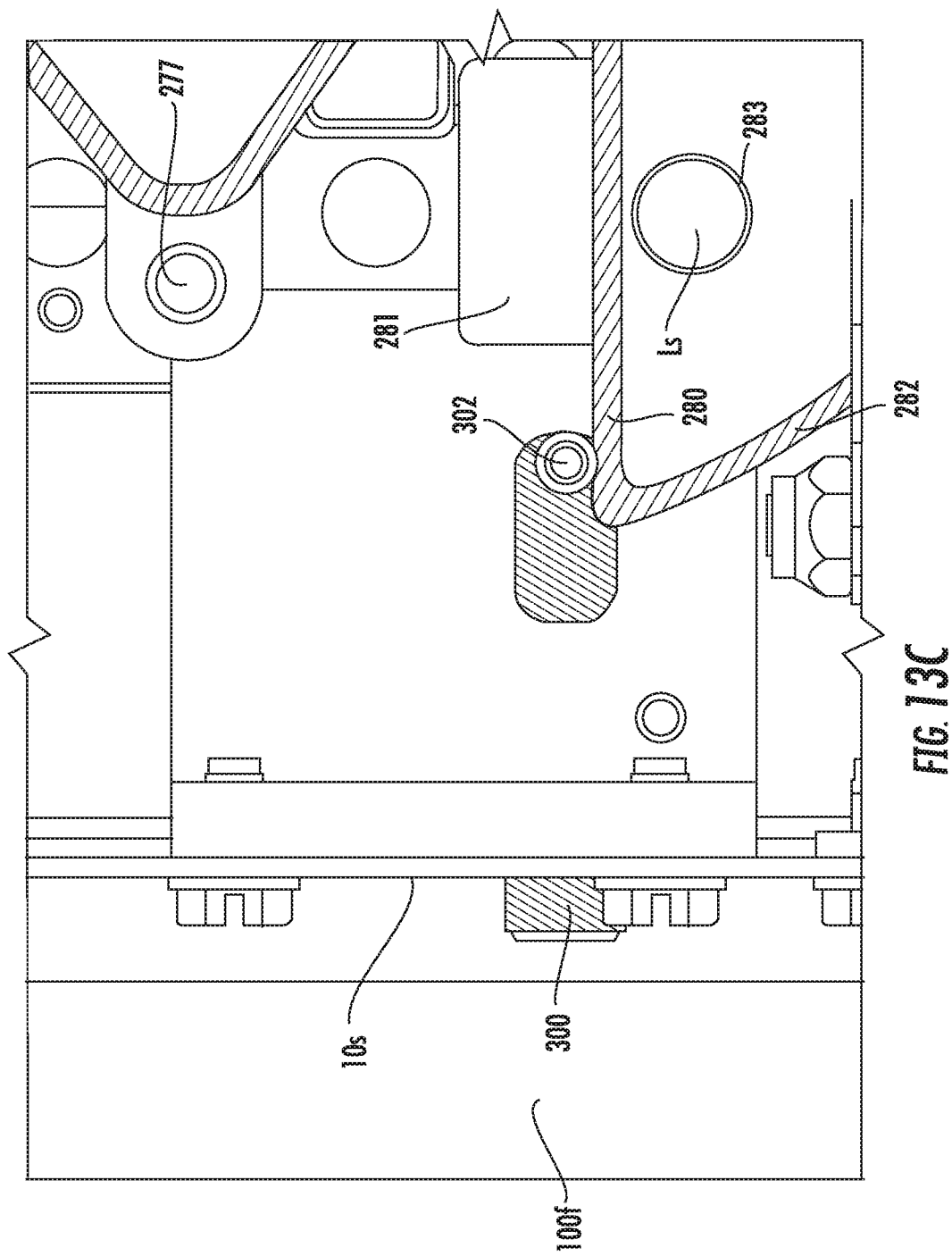
FIG. 13C is a front view of the enlarged partial view of the unit shown in FIG. 12A according to embodiments of the present invention.

This interlock $I_{2A}$ is provided by the shaft 302 engaging the surface 280 of the shutter cam to block the shutter cam 175 from rotating to the ON position as shown in FIG. 13C when the shaft 302 is slid left and resides over or on the surface 280.

Interlock 2B—Cabinet Interlock Blocked When Handle is On

Referring to FIG. 14, the shutter cam 175 can provide another cabinet interlock $I_{2B}$ so that the cabinet interlock 300 cannot be defeated if the handle 20h is in the ON position. FIG. 14 shows the position of the shutter cam 175 when the handle is ON (without the handle for ease of illustration). The shutter cam has an outer perimeter wall 285 that blocks the movement of the (manual) interlock pin 302 to prevent the interlock 300 from being moved to the unit unlocked from cabinet position.

Interlock 3—Door Closed Detection

Figure 15:
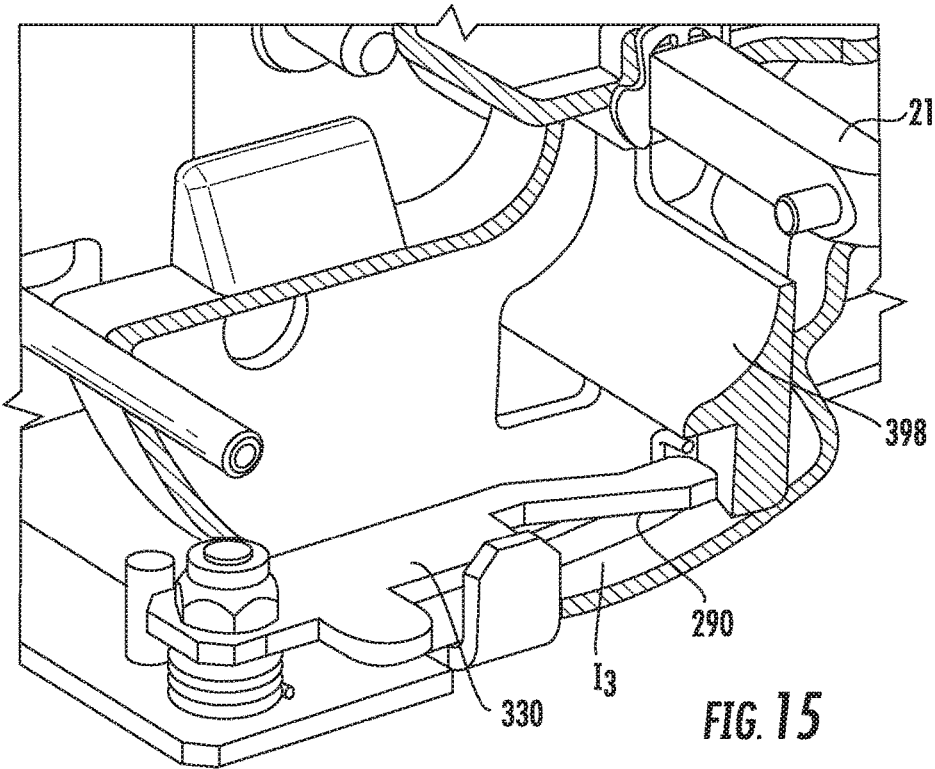
FIG. 15 is an enlarged partial side, front view of the unit shown in FIG. 12A to illustrate a cam blocking member that cooperably engages the shutter cam and prevents the shutter cam from rotating from OFF to ON if a cabinet door is open according to embodiments of the present invention.

Referring to FIG. 15, the shutter cam 175 can provide another interlock $I_3$ so that the handle 20h cannot be rotated to the ON position if the cabinet door 22 (FIG. 1) is open. A spring-loaded arm 330 can extend into a door interlock space 290 of the shutter cam 175 to block the shutter cam 175 from rotating from OFF to ON if the door is open. When the door is closed, the spring-loaded arm 330 can be pushed back which allows the shutter cam 175 to rotate to the ON position.

Interlock 4—Door Latch Release

Figure 16:
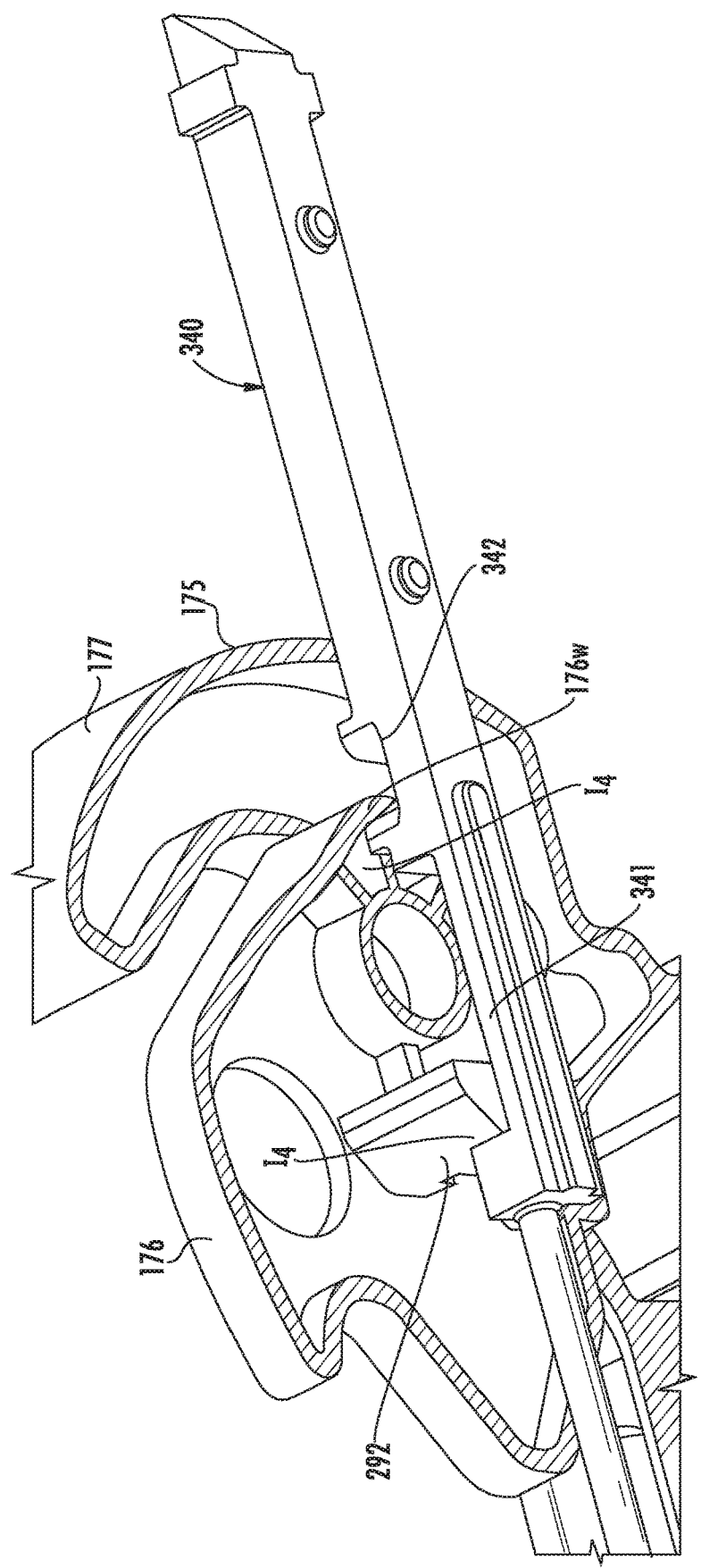
FIG. 16 is an enlarged partial side perspective view of the multi-purpose shutter cam cooperably engaging a door latch release that retracts the door latch when the handle is in the RESET position that prevents a cabinet door from opening if the handle is in any position other than RESET according to embodiments of the present invention.

Referring to FIG. 16, the shutter cam 175 can provide a door latch release interlock $I_4$. This interlock can require that the cabinet door latch 340 be closed to prevent the cabinet door 22 from opening if the handle 20h is in any position other than RESET.

In order to release the door latch 340 to open the door 22 (FIG. 1) the handle 20h must be rotated to the RESET position (associated with position of cam 175 shown in FIG. 16). The shutter cam 175 has a feature $I_4$ that actuates the door latch 340 to retract the door latch 340 only when the handle 20h is in the RESET position shown below so that the door 22 can be opened.

The latch 340 can have first and second laterally spaced apart slots 341, 342 that are open in a direction facing the shutter cam 175 and that engage at least one latch engagement feature 292 of the shutter cam 175. As shown, the at least one latch engagement feature 292 is on the first segment 176 of the shutter cam 175. The latch 340 can engage both an outer perimeter wall 176w of the first segment 176 as well as a planar and laterally spaced apart member as the at least one latch engagement feature 292.

Interlock 5—Key

Figure 17:
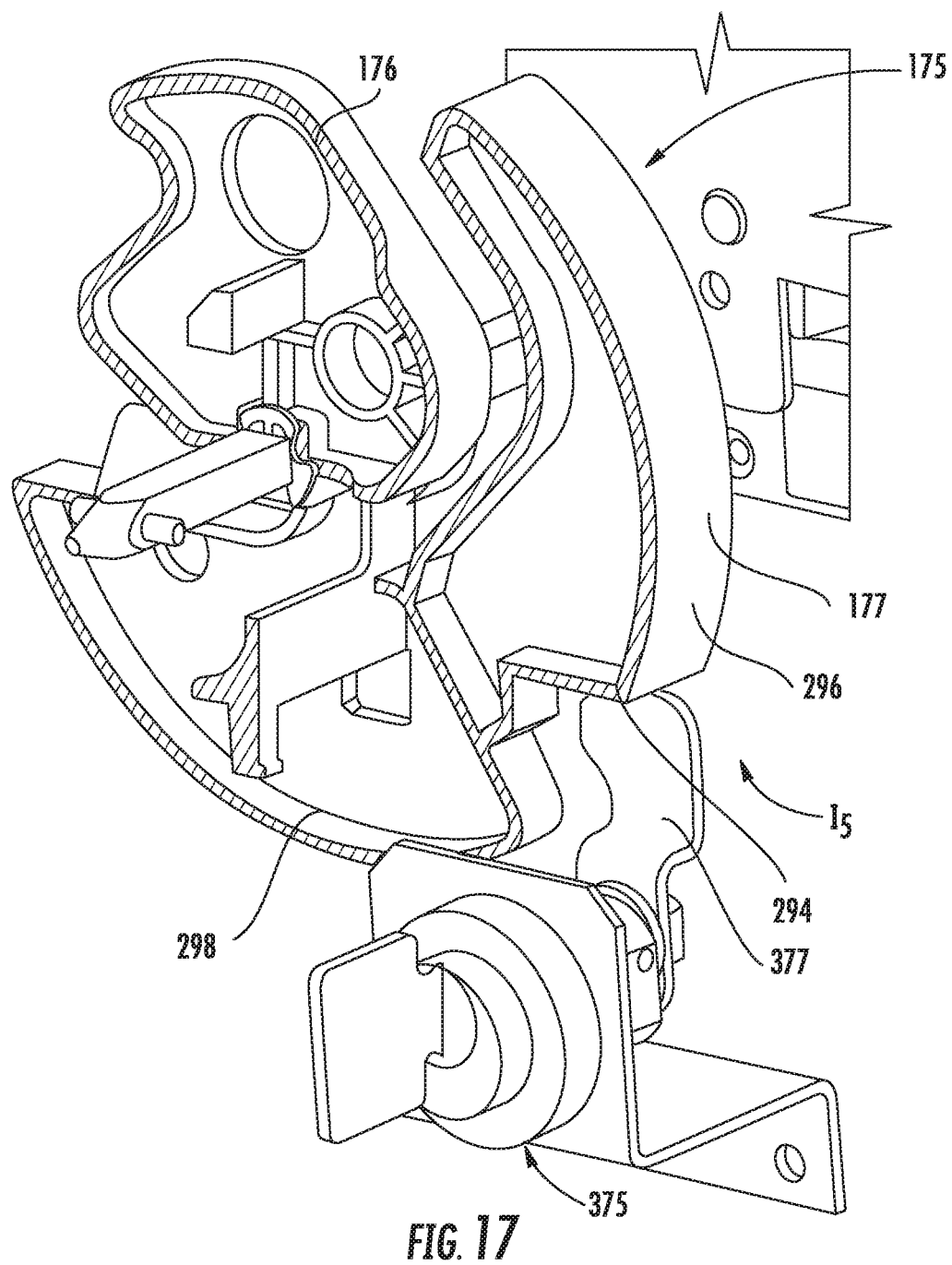
FIG. 17 is an enlarged partial side perspective view of the multi-purpose shutter cam cooperably engaging a keyed lock such that the shutter cam and handle are blocked from rotating when the key is in a locked position so that the handle cannot be rotated to an ON position according to embodiments of the present invention.

Referring to FIG. 17, the shutter cam 175 may optionally also provide an interlock $I_5$ comprising a manual key lock 375, which may be Kirk Key style lockout device 375 that engages a surface of the shutter cam 175. The handle 20h can be blocked from rotating to the ON position when the lock 377 is engaged (locked), shown as upright and blocking an outer, horizontally extending segment of the second segment of the cam 177 in this rotational position of the shutter cam 175. When the key lock 375 is in the locked position with the internal lock upright 377, the shutter cam 175 is blocked and therefore the handle 20h cannot be rotated to the ON position. The second segment of the shutter cam 177 can have a straight portion 294 that is between neighboring or adjacent curved (typically arcuate) perimeter portions 296, 298, that can provide the key lock interface $I_5$.

In addition, the shutter cam 175 can provide access to breaker lug screws when the handle 20h is in the OFF position which allows the operator to easily tighten the lugs as needed. This holds true for a variety of breaker frame sizes. See, for example, FIG. 13C, an aperture 283 in the cam shutter 175 provides access to a phase C lug screw. Phases A and B lug screws are above Phase C and are not blocked by the shutter cam 175 in the OFF position.

In some embodiments, the shutter cam 175 can also provide a "no-load" trip indicate. When the breaker trips, the shutter cam 175 can be free to rotate from the ON to TRIPPED position without applying any load to the shutter cam 175 in order to reduce or minimize drag as the handle 20h rotates from the ON to TRIPPED position. As discussed above with respect to FIG. 10D, for example, the shutter 75 does not move (it is stationary) as the outwardly projecting members 277 do not engage the shutter cam 175. As the shutter 75 does not move, there is no additional drag.

In some embodiments, the bucket assembly 10 can comprise a molded case circuit breaker as the disconnect assembly 30. Molded case circuit breakers are well known to those of skill in the art, as exemplified by U.S. Pat. Nos. 4,503,408 and 5,910,760, the contents of which are incorporated herein by reference as if recited in full herein. In other embodiments, the bucket assembly 10 can be configured to house a fused disconnect switch to turn power on and off. In some embodiments, the MCC cabinet 100 (FIG. 1) can hold both a fused disconnect switch and circuit breaker type units 10 and each can have a standardized rotary handle 20*h* that controls the internal components for power on/off operation.

The unit 10 can be configured so that the stab S is offset to reside closer to one side of the unit, e.g., so that a left side stab 46 or right side stab 50 (and/or the center stab 48) is closer to a respective left or right side of the unit 10. FIGS. 7, 9A and 9B show the center stab 48 as residing closer to the right side of the unit 10, according to some embodiments.

The lateral stroke distance of the shutter 75 in each direction, right to left and/or left to right to open/close the access path to the lead screw 143 can be between about 0.25 inches to about 3 inches, more typically between about 1 inch to about 2 inches.

The handle 20*h* can be provided with different handle lengths, shown in FIG. 3 as a long handle version and in FIG. 1 as a shorter handle 20*h*. An intermediate length handle may also be used for some embodiments (not shown).

FIG. 3 illustrates units 10 with a single handle 20*h* adjacent a device or "pilot" device panel 123 configured with apertures to receive various control input members and/or indicating light devices. The devices 166 can include pilot control devices, indicating lights, user inputs such as push buttons and/or selector switches and the like. There are many different variations that can be used as is well known to those of skill in the art. While six devices 166 and respective holding or receiving aperture are shown, the device panel 122 can be configured with more or less aperture and hold more or less control input members and/or indicating lights, for example.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the invention.

That which is claimed is:

1. A bucket, comprising:
   a bucket housing with laterally spaced apart sidewalls and at least one front panel;
   an operator handle residing in front of the at least one front panel and having an inwardly extending drive shaft;
   a shutter cam attached to the drive shaft, wherein the shutter cam comprises a first cam segment with a first curvilinear outer perimeter and a second cam segment with a second curvilinear outer perimeter, and one of the first cam segment and the second cam segment resides behind another of the first cam segment and the second cam segment, in a front-to-back direction of the bucket housing; and
   at least one shutter positioned between the first and second cam segments of the shutter cam, the at least one shutter comprising a primary body with a shutter portal, the at least one shutter further comprising first and second laterally spaced apart outwardly projecting members that reside at a level below the shutter portal,
   wherein the first cam segment of the shutter cam engages the first outwardly projecting member to laterally slide the at least one shutter in a first direction to a position that misaligns the shutter portal with a socket of a lead screw in the bucket when the operator handle is in a first position,
   wherein the first cam segment of the shutter cam engages the second outwardly projecting member to laterally slide the at least one shutter in a second direction opposite the first direction to a position that aligns the shutter portal with the socket of the leadscrew when the operator handle is in a second position, and
   wherein the second cam segment provides at least one interlock engagement feature for releasably engaging at least one of a cabinet lock pin, a manual key lock or a door latch that prevents the operator handle from rotating.

2. The bucket of claim 1, wherein the at least one shutter comprises a lateral extension with a downwardly extending planar vertically oriented segment residing above the drive shaft and positioned between the first and second cam segments of the shutter cam in the front-to-back direction and projecting in a direction towards the first cam segment, the downwardly extending planar vertically oriented segment comprising the first and second laterally spaced apart outwardly projecting members, and wherein the second cam segment resides behind the first cam segment in the front-to-back direction of the bucket housing.

3. The bucket of claim 1, wherein the first and second cam segments are joined at a neck portion that has a channel that receives the drive shaft, and wherein in a planar view of the shutter cam, the first cam segment has a portion of the first curvilinear outer perimeter facing an adjacent longitudinally and laterally spaced apart curvilinear perimeter portion of the second curvilinear outer perimeter of the second cam segment.

4. The bucket of claim 1, wherein the shutter cam is a three dimensional single monolithic member, and wherein the shutter cam further comprises a first forwardly projecting segment attached to the first cam segment and a second forwardly projecting segment attached to the second cam segment.

5. The bucket of claim 1, wherein the first cam segment has a distance that is less than a maximal radius of the second cam segment, the radius measured from a centerline of the drive shaft.

6. The bucket of claim 1, wherein in a planar view of the shutter cam, the second cam segment has a portion of the second curvilinear outer perimeter that is adjacent to a portion of the first curvilinear outer perimeter of the first cam segment with a curvilinear gap space between the adjacent portions of the first and second curvilinear outer perimeters of the first and second cam segments.

7. The bucket of claim 1, wherein the shutter cam further comprises at least one of:
   (i) a first forwardly projecting segment attached to the first cam segment and a second forwardly projecting segment attached to the second cam segment;
   (ii) at least one lug access aperture to thereby allow access to a phase A, B or C lug screw in an OFF position associated with non-conduction; or
   (iii) a planar rear surface with the second cam segment having an outer perimeter wall that is orthogonal to the planar rear surface and projects rearward a distance from the planar rear surface of the second cam segment.

8. The bucket of claim 1, wherein the shutter cam further comprises a planar rear surface with the second cam segment having an outer perimeter wall that is orthogonal to the planar rear surface and projects rearward a distance from the planar rear surface of the second cam segment, and wherein the second cam segment has a portion of the second curvilinear outer perimeter that faces a curvilinear gap space that has a circumferential angular extent, measured from a center of the shaft, that is between 90-270 degrees.

9. The bucket of claim 1, wherein the at least one of the cabinet lock pin, the manual key lock or the door latch includes the cabinet lock pin, and wherein the cabinet lock pin extends laterally and resides behind the shutter cam in the bucket housing, the laterally extending cabinet lock pin attached to an actuator rod that slidably moves the cabinet lock pin between engaged and disengaged positions, wherein the actuator rod extends forward toward the operator handle a length sufficient to engage a first portion of the second curvilinear outer perimeter of the second cam segment of the shutter cam as a first of the at least one interlock feature of the second cam segment and block the operator handle from rotating to an ON position as the first position when the cabinet lock pin is in the engaged position.

10. The bucket of claim 9, wherein a different second portion of the second curvilinear outer perimeter of the second cam segment of the shutter cam resides adjacent the actuator rod when the actuator rod is in the engaged position as a second of the at least one interlock feature and blocks movement of the actuator rod when the operator handle is in the ON position as the first position to thereby prevent the cabinet lock pin from being moved to the disengaged position.

11. The bucket of claim 9, wherein the second curvilinear outer perimeter of the second cam segment comprises a straight portion adjacent a curvilinear outer portion, and wherein the actuator rod extends over the straight portion as the first portion to engage the second cam segment of the shutter cam and block the handle from rotating to the ON position when the cabinet lock pin is in the engaged position.

12. The bucket of claim 1, wherein the second cam segment of the shutter cam has a lower interior recessed space as a door interlock feature as the at least one interlock feature and that releasably engages a spring-loaded arm to thereby block the shutter cam from rotating from an OFF position to an ON position when a door of a cabinet is open, the door of the cabinet opens to permit access to the bucket.

13. The bucket of claim 1, wherein the at least one of the cabinet lock pin, the manual key lock or the door latch includes the door latch, and wherein the door latch is attached to the shutter cam and controllably engages a cabinet door to prevent the cabinet door from opening if the operator handle is any position other than a RESET position, the cabinet door opens to permit access to the bucket.

14. The bucket of claim 1, wherein the at least one of the cabinet lock pin, the manual key lock or the door latch includes the door latch, and wherein the door latch is attached to the first cam segment of the shutter cam and extends laterally outward from the shutter cam and that prevents the door latch from retracting if the operator handle is in any position other than a RESET position.

15. The bucket of claim 14, wherein the door latch comprises laterally spaced apart slots that engage first and second laterally spaced apart latch engagement features of the first cam segment of the shutter cam.

16. The bucket of claim 1, wherein the second curvilinear outer perimeter of the second cam segment comprises a straight portion between two adjacent arcuate portions.

17. A motor control center (MCC), comprising:
a cabinet housing with first and second sidewalls defining an enclosure with a plurality of compartments, the compartments configured to removably receive a plurality of units, wherein at least one of the units comprises:
a unit housing having a front panel and opposing laterally spaced apart sidewalls that extend rearward of the front panel of the unit housing;
an operator handle residing in front of the front panel and having an inwardly extending drive shaft;
a shutter cam attached to the drive shaft, wherein the shutter cam comprises a first cam segment and a second cam segment, and wherein the second cam segment is parallel with the first cam segment and is offset in a front to back direction of the unit housing to reside behind the first cam segment;
a shutter in communication with the shutter cam, the shutter comprising a primary body with a shutter portal and a laterally extending portion residing a lateral distance away from the shutter portal, the lateral distance is in a side-to-side direction that is perpendicular to the front-to-back direction, the laterally extending portion comprising a downwardly extending segment residing between the first and second cam segments of the shutter cam and comprising first and second laterally spaced apart outwardly projecting members; and
a laterally extending cabinet lock pin residing behind the shutter cam in the unit housing, the laterally extending cabinet lock pin attached to an actuator rod that slidably moves the cabinet lock pin between engaged and disengaged positions, wherein the actuator rod extends forward toward the operator handle a length sufficient to engage the second cam segment of the shutter cam and block the operator handle from rotating to an ON position as the first position when the cabinet lock pin is in the engaged position.

18. The MCC of claim 17, wherein the downwardly extending segment of the shutter comprises a planar vertically oriented segment that terminates above the drive shaft the planar vertically oriented segment comprising the first and second laterally spaced apart outwardly projecting members, and wherein the first and second laterally spaced apart outwardly projecting members project in a direction towards the first cam segment.

19. The MCC of claim 17, wherein the first and second cam segments are attached together, and wherein in a planar view of the shutter cam, the first cam segment has a first curvilinear outer perimeter portion facing an adjacent longitudinally and laterally spaced apart curvilinear perimeter portion of the second curvilinear outer perimeter of the second cam segment.

20. The MCC of claim 19, wherein in the planar view of the shutter cam, the second cam segment has the second curvilinear outer perimeter portion adjacent to the first curvilinear outer perimeter portion of the first cam segment with a curvilinear gap space between the adjacent first and second curvilinear outer perimeter portions of the first and second cam segments.

21. The MCC of claim 20, the shutter cam further comprises at least one of:
(i) a first forwardly projecting segment attached to the first cam segment and a second forwardly projecting segment attached to the second cam segment;
(ii) at least one lug access aperture to thereby allow access to a phase A, B or C lug screw in an OFF position associated with non-conduction; and (iii) a planar rear surface with the second cam segment having an outer perimeter wall that is orthogonal to the planar rear surface and projects rearward a distance from the planar rear surface of the second cam segment.

22. The MCC of claim 17, wherein the second cam segment of the shutter cam further comprises a door interlock feature that releasably engages a spring-loaded arm to thereby block the shutter cam from rotating from an OFF position to the ON position when a cabinet door of the cabinet housing is open, and wherein the first cam segment of the shutter cam further comprises a door latch release interlock feature, the first cam segment is attached to a door latch that slidably engages the cabinet door of the cabinet housing to prevent the cabinet door from opening if the operator handle is any position other than a RESET position.

* * * * *

UNITED STATES PATENT AND TRADEMARK OFFICE
CERTIFICATE OF CORRECTION

PATENT NO. : 10,211,606 B2
APPLICATION NO. : 15/786248
DATED : February 19, 2019
INVENTOR(S) : Kroushl et al.

Page 1 of 1

It is certified that error appears in the above-identified patent and that said Letters Patent is hereby corrected as shown below:

In the Specification

Column 13, Line 19:
Delete "277$i$" and insert -- 277$l$ --

Column 16, Line 42:
Delete "I $_5$" and insert -- $I_5$ --

In the Claims

Column 20, Line 16, Claim 17:
Delete "front to back" and insert -- front-to-back --

Signed and Sealed this
Fourth Day of June, 2019

Andrei Iancu
*Director of the United States Patent and Trademark Office*